United States Patent [19]
Grodstein et al.

[11] Patent Number: 5,657,239
[45] Date of Patent: Aug. 12, 1997

[54] TIMING VERIFICATION USING SYNCHRONIZERS AND TIMING CONSTRAINTS

[75] Inventors: Joel J. Grodstein, Arlington; Nicholas L. Rethman, Hudson; Jeng-Wei Pan, Westborough, all of Mass.

[73] Assignee: Digital Equipment Corporation, Maynard, Mass.

[21] Appl. No.: 969,933

[22] Filed: Oct. 30, 1992

[51] Int. Cl.$^6$ .................................................. G06F 17/50
[52] U.S. Cl. ............................................ 364/488; 364/578
[58] Field of Search ............................ 364/488, 489, 364/490, 578; 395/500

[56] References Cited

U.S. PATENT DOCUMENTS

| | | | |
|---|---|---|---|
| 4,924,430 | 5/1990 | Zasio et al. | 364/578 |
| 5,095,454 | 3/1992 | Huang | 364/578 |
| 5,191,541 | 3/1993 | Landman et al. | 364/489 |
| 5,210,700 | 5/1993 | Tom | 364/489 |
| 5,278,769 | 1/1994 | Bair et al. | 364/490 |
| 5,355,321 | 10/1994 | Grodstein et al. | 364/489 |

OTHER PUBLICATIONS

"Timing Verification on a 1.2M-Device Full-Custom CMOS Design" by Jengwei Pan et al. published in proceedings of DAC 91, the ACM/IEEE Design Automation Conference, Jun. 1991.

"Automatic Detection of MOS Synchronizers for Timing Verification" by Joel Grodstein et al., published in ICCAD '91, IEEE Int'l Conference on Computed Aided Design, Santa Clara, Nov. 11–14, 1991.

"Constraint Identification for Timing Verification" by Joel Grodstein et al., published in ICCAD '90, IEEE Int'l Conference on Computer Added Design, Nov. 1990.

*Primary Examiner*—Vincent N. Trans
*Attorney, Agent, or Firm*—Fish & Richardson P.C.

[57] ABSTRACT

A computer-based method and program for improving a design of a circuit through analysis of a computer stored model of the circuit. Individual synchronization points are identified in the circuit at each of which a signal may be blocked or allowed to pass in response to appearance of a second signal at the synchronization point. The timing of the circuit is verified based on the individual synchronization points.

16 Claims, 21 Drawing Sheets

FIG. 5a (Prior Art)

| 300 → step | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|
| 302 → time | 1 | 12 | 13 | 26 | 27 | 27 | 27 | 26 | 13 | 32 | 33 | 33 | 33 | 32 | 13 | 12 | 1 | 8 | 9 | 8 | 1 | 1 |
|  | A |  |  |  |  |  |  |  |  |  |  |  |  |  |  |  |  |  |  |  |  |  |
|  | $L_v$ | C | D | E | G | $L_w$ | G | E | D | F | G | $L_w$ | G | F | D | C | A | B | D | B | A | $L_v$ |
|  |  | A | C | D | E | G | E | D | C | D | F | G | F | D | C | A | $L_v$ | A | B | A | $L_v$ |  |
|  |  | $L_v$ | A | C | D | E | D | C | A | C | D | F | D | C | A | $L_v$ |  | $L_v$ | A | $L_v$ |  |  |
|  |  |  | $L_v$ | A | C | D | C | A | $L_v$ | A | C | D | C | A | $L_v$ |  |  |  | $L_v$ |  |  |  |
|  |  |  |  | $L_v$ | A | C | A | $L_v$ |  | $L_v$ | A | C | A | $L_v$ |  |  |  |  |  |  |  |  |
|  |  |  |  |  | $L_v$ | A | $L_v$ |  |  |  | $L_v$ | A | $L_v$ |  |  |  |  |  |  |  |  |  |
|  |  |  |  |  |  | $L_v$ |  |  |  |  |  | $L_v$ |  |  |  |  |  |  |  |  |  |  |

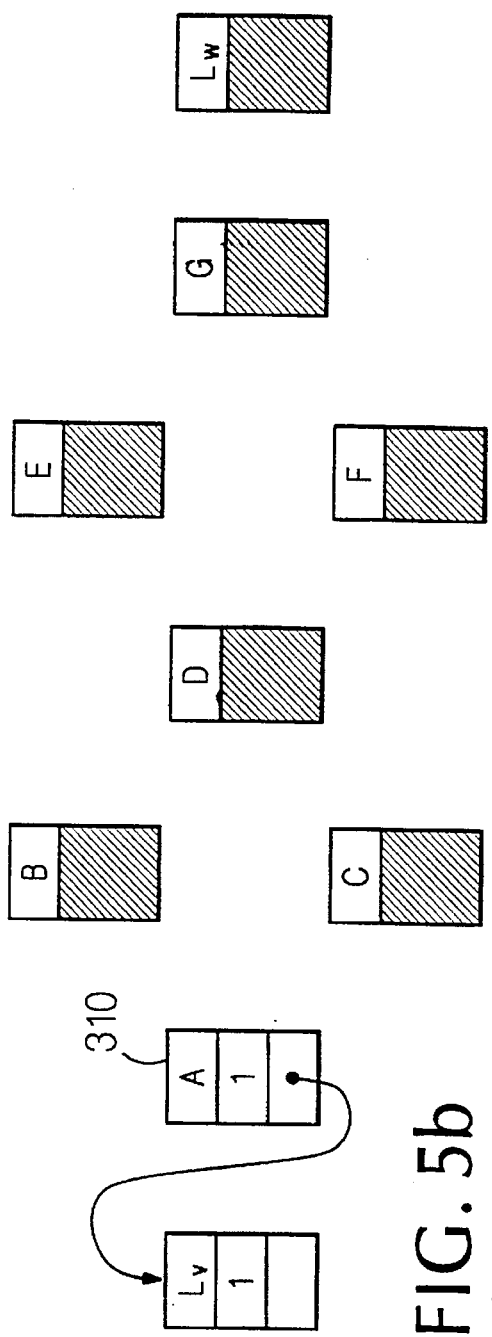
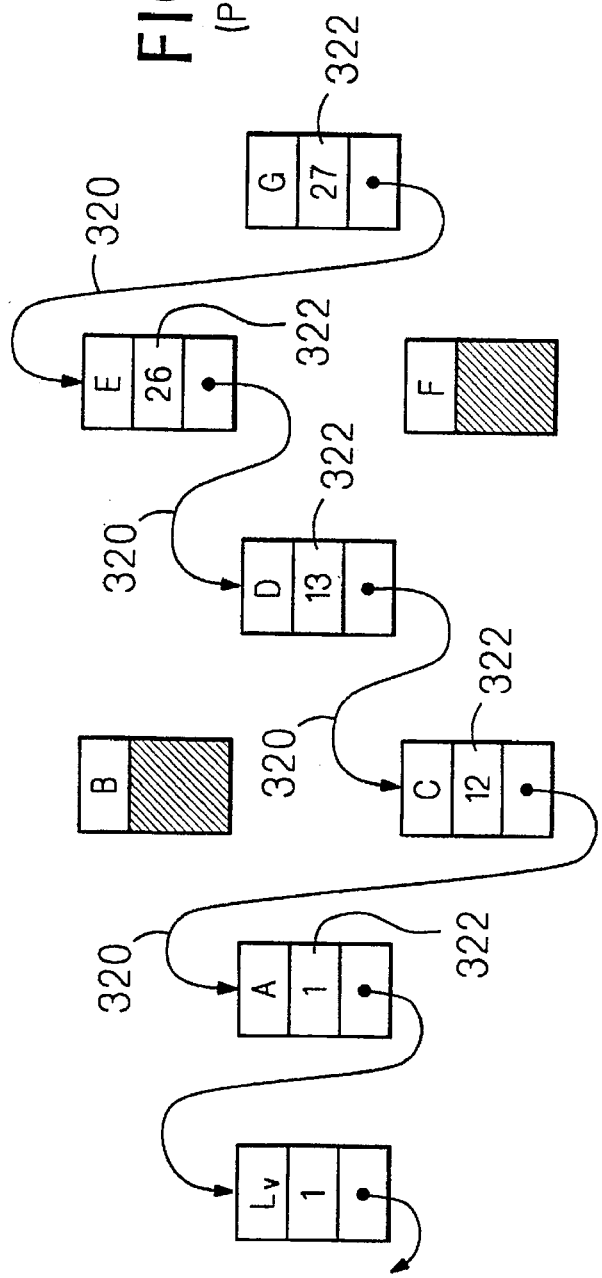
FIG. 5b (Prior Art)
FIG. 5c (Prior Art)

$R = \emptyset_1 A + \emptyset_2 AB$

```
/******************************************************************/
/* This function first initializes all of the gate and source pass masks.  */
/* It then correctly sets all source masks.  Source masks are cleared      */
/* when the gate of a device forces the transistor off for a given phase.  */
/* This means that only devices with a clocked input can have their source */
/* mask cleared.                                                           */
/******************************************************************/
init_and_solve_source_masks()
{
   for each device
      {
         turn off the gate pass mask;
         turn on the source pass mask;

if (the gate node of this device is a clock node)
            for each phase that the device is definitely off
               turn off the source pass mask in that phase;
      }
} create_synchronizers ()
{
   /* First, solve the source pass-masks for all devices.  This is a very */
   /* simple algorithm. */
   init_and_solve_source_masks();

for each device
      /* The status bit is used as a "visited" bit, since the       */
      /* solve_important_node routine solves many devices at once. */
      dev->status = FALSE;

/* Now, do the gates.  This is MUCH harder! */
   /* The 'important node' is because we will solve an entire single-output */
   /* CCR in one fell swoop.  Typically, output nodes are important. */
   for each unmarked device whose drain node is "important"
      solve_important_node(its drain node);
} solve_important_node(node)
{
   generate the set and clear equations for this output node;

if (there are no clocks anywhere in the equation)
      /* this is a nice shortcut -- if there are no clocks in the equation, */
      get rid of all synchronizers in this region;

else
   {
         solve_gate_mask ("set" equation);
         solve_gate_mask ("clear" equation);

}
}
```

FIG. 10A: pseudocode for synchronizer analysis

```
/********************************************************************
** This function does most of the work for solving devices' gate masks.
** The basic idea is that if, in phase P, there exists some combination of
** setting_other_devices on/off, such that toggling device D changes whether
** the equation (either a set or a clear equation) is on or off, then device
** D passes in phase P.
** This routine uses a very big shortcut. All pins are initially blocked.
** Then, once a pin is found to be unblocked in phase P for any path X, you
** no longer have to check it for any other paths X' in phase P. This is
** because of assumption #3 in the ICCAD paper - synchronizers do not have
** false paths, so if one is on for _any_ path, then it is on for all paths.
********************************************************************/
solve_gate_mask( equation ) {
    /* Mark all the elements that have a synonymed or complemented node.*/
    /* This is done for another shortcut -- if all of the inputs to an */
    /* equation are independent, then it can be solved very fast. */
    contains_comps = mark_same_and_comp(h_or);

for each phase in the system {
        set all clock-like nodes to their appropriate values for this phase;

for each 'or' minterm in the equation {
            /* Try to set all elements in the current minterm active, making */
            /* sure to correctly set all synonym/complement devices in other */
            minterm_can_on_this_phase = TRUE;
            for each individual literal 'and' in the 'or' minterm
                if (it is set at UNKNOWN)
                    set it to ON;
                else if it is set to OFF
                    /* I.e., comp of something else, or a forced-off clock */
                    minterm_can_be_on_this_phase + FALSE;

/* for each device: if (1) its minterm could be on with the device
            ** on, and (2) turning off the device can turn off its minterm and
            ** thereby turn off the equation, then the device is unblocked. */
            for each individual device 'and' in the 'or' minterm {
                if (the device is already unblocked)
                    continue;   /* short cut -- already unblocked. */
                if (the device is not tied to a clock) {
                    if(minterm_can_be_on_this_phase)        {
                        turn the device off;

if (equation can be off)
                            /* this is checked by exhaustive toggling. But a
                            ** shortcut exists -- if there are no complements in
                            ** the equation, it can definitely be turned off. */
                            unblock this device in this phase;
                        turn this device back on (to prepare for the next one);
                    }
                } else {
                    /* Here, the device must be a clock device.*/
                    if (there is no subsetting in time)
                        unblock this device in this phase;
                }
            }
            /* We've finished with this minterm. */
            Restore all its devices back to their forced values for this phase,
            if any. Otherwise, to unknown;
        }
    }
}
```

FIG. 10B: pseudocode for synchronizer analysis

```
ntv$mark_timing_checks ()
{
    /* This first routine gets any pass/tristate/precharge-discharge, */
    /* optionally followed by a weak-feedback structure. */
    for each dynamic node
    {
        if (it's a feedback node)
            feedback_input = the sensing node of the feedback structure;
        else
        {
            check_complete_swing (dynamic_node, RIE, dynamic_node,
                                  RISE, phi1&2&3&4, NULL, NULL_BIT);
            check_complete_swing (dynamic_node, FALL, dynamic_node,
                                  FALL, phi1&2&3&4, NULL, NULL_BIT);
        } else
        {
            check_complete_swing (dynamic_node, RISE,feedback_node,
                                  FALL, phi1&2&3&4, NULL, NULL_BIT);
            check_complete_swing (dynamic_node, FALL,feedback_node,
                                  RISE, phi1&2&3)4, NULL, NULL_BIT);
        }
    }

/* Glitch sources from dynamic nodes. */
    for each dynamic node except gate_internals
        for each phase it can be dynamic
        {
            if node can conditional_fall in that phase
                avoid_glitches (node, phase, falling);
            if node can conditional_rise in that phase
                avoid_glitches (node, phase, rising);
        }
}
```

FIG. 11A: pseudocode for timing constraint analysis

```
check_complete_swing (gate_node, feedback_input, active_phases, this_node,
                      pre_dis_flag, clock_node, ck_device_is_N)
{
   for each non-feedback path DRIVING this node
     which conducts the right sense (according to pre_dis_flag)
   {
      new_clock = clock_node;
      new_ck_is_N = ck_device_is_N;
      new_active_phases = active_phases;

if ((device_gate = the path's device's gate) is a clock)
      {
         /* Figure out what this clock gating does. */
         this_device_active = phases_may_be_active (this_device);
         new_active_phases = this_device_active & active_phases;

/* If this clock is the one which shuts off the stack... */
         if (new_active_phases shuts off (i.e., 1->0) in a different
                 phase than active_phases)
            new_clock = device_gate;
         if (clock_node == NULL)
            new_clock = device_gate;
         if (new_clock == device_gate)
            new_ck_is_N = N or P of this device;
      }

/* and recurse or finish. */
      if (we've not reached the end of the chain)
         found |= check_complete_swing
                    (gate_node, feedback_input, new_active_phases,
                     device's drain, pre_dis_flag, new_clock, new_ck_is_N);
      else
         if (new_clock != NULL)
         {
            found = TRUE;
            mark that check_node must swing completely to check_sense
                 before clock_node is shut off.
         }
   }
   return (found);
}
```

FIG. 11B: pseudocode for timing constraint analysis

```
avoid_glitches (recurse_node, path_list, phi, bad_glitch_sense)
{
    if (the path is still glitch sensitive)
        for each non-feedback path 'fanout_path' driving recurse_node
            if (fanout_path can conduct bad_glitch_sense)
                & (the path's device isn't off in phase 'phi')
            {
                push (fanout_path, path_list);
                avoid_glitches (node on other side of fanout_path, path_list,
                                phi, bad_glitch_sense);
                pop (path_list);
            }
    else
    {
        for (each xref_path from path_list)
            if ((it's a clock which can turn on its device in 'phi')
                &(it's the first clock we've hit))
                remember it as 'turnon_clock', 'clock_on_sense';
        if (we've not found a turnon_clock)
            return; /* this path cannot glitch on in phase 'phi'. */ for (each path from path_list)
        {
            device = its device, 'node' = device's gate node;

/* If we're trying to avoid a dynamic stack, then only bother */
            /* doing a setup check when this input has dynamic fanout.    */
            if (finish_node is static | has_dynamic_fanout (device, node))
            {
                if (node ! = turnon_clock & ^node.state)
                {
                    mark that the data ('node') must turn OFF it's device
                        before 'clock_node' turns ON its device;
                    if (finish_node is dynamic & doing charge-share checks)
                    /* charge-share checks are not done on static clocks. */
                        mark that 'node' must turn ON before clock hits, also;
                    node.state = TRUE;
                } if (node is a static conditional clock and ^node.state)
                /* generally, we must make sure that clock inputs don't */
                /* glitch.  But:  dynamic nodes never glitch, by        */
                /* definition, and neither do unconditional clocks.     */
                {
                    son_bad_glitch_sense = high_ if_N (device);
                    avoid_glitches (node, NULL, phi, son_bad_glitch_sense,node);
                }
            }
        }
    }
}
```

FIG. 11C: pseudocode for timing constraint analysis

```
still_glitch_sensitive (node, path_list, phi)
{
    IF (path_list is empty)
        return (TRUE);
    /* Generally, if the node isn't doing anything on 'phi', then neither  */
    /* it nor anything driving it can cause downstream stuff to glitch     */
    /* on phi.  Vdd and Vss are just fast stability checks.  Furthermore,  */
    /* we never need to go into a dynamic gate, since that will be checked */
    /* separately.  The only time we need to go into a gate at all is if   */
    /* it's a static clock (i.e., virtual ground).                         */
    return (-node.vdd_node & -node.vss_node
        & node is not stable, i.e., high, low, or valid on phase phi
        & -node.io_pin
        & (-node.gate_node | (node.static_node & node.clock_node)))

}
```

FIG. 11D: pseudocode for timing constraint analysis $A\phi_{abc}$ synchronizer exists at $P$ iff $PASS$ $(N, M, \phi_x)$ is true only in phase(s) $\phi_x \in \phi_{abc}$ $PASS(N, M, \phi_x) \equiv min(R, M)\overline{subset(R, N, M)}$
$+ min(S, M)\overline{subset(S, N, M)}$ $min(F, M) \equiv$ all minterms, in a sum-of-products representation of $F$, which represent paths containing $M$.

$\overline{subset(F, N, M)} \equiv \overline{subset-in-time(F, M)}$ (if $N$ transitions unconditionally in $\phi_x$)

$\equiv (F|_{N=0} \oplus F|_{N=1})$
otherwise.

FIG. 12

$$\frac{dF_1}{du} = \frac{\partial F_1}{u} \oplus (\frac{\partial F_1}{\partial v} \cdot \frac{\partial v}{\partial u}) \oplus \frac{\partial^2 F_1}{\partial u \partial v} \neq \frac{\partial F_1}{\partial u}\Big|_{v=v_0}$$

FIG. 13

TIMING VERIFICATION USING SYNCHRONIZERS AND TIMING CONSTRAINTS

BACKGROUND OF THE INVENTION

This invention relates to timing verification of circuits.

Prototyping a VLSI (very large scale integrated circuit) design, for example, is extremely expensive: fabbing (fabricating) a pass of a prototype full-custom VLSI chip may take several months and may cost several hundred thousand dollars. If the chip design is flawed, the chip itself is almost impossible to probe to isolate the problem and determine corrections to the design. For this reason, virtually all VLSI chips are designed and thoroughly verified by software modelling before the first actual silicon is fabbed.

A timing verifier is one program in the suite of software tools used by a VLSI designer to verify a design. Timing verification is the process of analyzing the circuit model to ensure that signals will propagate through the logic quickly enough to meet timing requirements at a specified clock frequency. (A timing verifier may also include other functions, for instance analysis for race conditions or other logic problems.) Once the circuit has been largely designed using other tools of the suite, the timing verifier is used to improve the circuit by, e.g., eliminating bottlenecks that would force the circuit to be run at a slow clock frequency.

The timing verifier takes as input a description of the circuit and its interconnections, the impedances and/or loading of the wires, specifications of the devices in the logic path, and descriptions of the clocked elements, and produces as output the timing of the slowest paths, i.e., the "critical paths", from which the designer can deduce the maximum clock frequency at which the circuit can be run. The designer can then redesign the critical paths to speed them up, thus speeding up the entire circuit. This process is typically iterative: the designer runs the timing verifier, and modifies his circuit design using the information generated. He repeats this process until the number of critical paths with the same timing limit is so large that reducing the time of all of them becomes impractical.

In a synchronous integrated circuit (IC) design, major signals are captured in latches at clock edges and are held at stable values when and while the clock is deasserted. The value of the signal at the output of a latch, a latched signal, is only allowed to change during the time the clock signal is asserted. During the time the clock is asserted, changes on the D input to the latch immediately propagate through the latch to the Q output; thus the clock assertion is said to make the latch transparent. The latched signals then propagate downstream through combinatorial logic to other latches. The timing verifier reports any latches (or other clocked element) whose inputs are not stable soon enough in time to meet the requirements of the latch's clock.

FIG. 1 depicts a simple illustrative circuit, which will be considered under a simplified model of timing constraints and design rules. Two input signals A 100 and B 102 are latched by latches 108 and 110. Thus, signals A' 112 and B' 114 are stable except when the two latches 108 and 110 are transparent, which occurs when clocks $Ck_A$ 104 and $Ck_B$ 106 are asserted. Once A' and B' have been latched, they remain stable, and combinatorial logic $CL_1$ 116, $CL_2$ 120, and $CL_3$ 122 compute signals Y 124 and Z 126. Each of $CL_1$, $CL_2$, and $CL_3$ impose a certain delay in this computation. The downstream part of the design (not shown) relies on Y 124 and Z 126 being latched by latches 132 and 134 on clocks $Ck_Y$ 128, and $Ck_Z$ 130. Thus, $CL_1$, $CL_2$, and $CL_3$ must be fast enough to meet the setup requirements of latches 132 and 134.

FIG. 2 presents a timing diagram for the circuit of FIG. 1. The first three lines show the clocks $Ck_A$ 104, $Ck_B$ 106, $Ck_Y$ 128, and $Ck_Z$ 130. In this example, A and B are latched on the same clock. Signals A and B must be stable far enough before the falling edge of $Ck_A/Ck_B$ 206 to accommodate a "setup time" 208, a characteristic of latches 108 and 110. Once latches 108 and 110 become transparent during $Ck_A/Ck_B$ 204, (assuming that the setup time and the data-to-output time of the latches are equal) signals A' and B' are allowed to transition until they are latched on the falling edge of $Ck_A/Ck_B$ 206. A' and B' drive $CL_1$, $CL_2$, and $CL_3$, which in turn produce signals X, Y, and Z. Under the simplified timing rules, the timing constraints of the circuit are satisfied if the propagation delay 208 of latch 108 plus the propagation delays through $CL_1$ 216 plus $CL_2$ 220 plus the setup time 232 of latch 132 is less than the time from the fall of clock $Ck_A/Ck_B$ to the fall of clock $Ck_Y$ 228, and if the propagation delay 208 of latch 110 plus the time delay through $CL_1$ 216 plus $CL_3$ 222 plus the setup time 234 of latch 134 is less than the time from the fall of clock $Ck_A/Ck_B$ to the fall of clock $Ck_Z$ 230. The paths of A'-$CL_2$-Y and B'-$CL_3$-Z must also meet the timing requirements of latches 132 and 134, but these will be trivially satisfied because they are clearly faster than paths A'-$CL_1$X-$CL_2$-Y and B'-$CL_1$-X—$CL_3$-Z. When all these conditions are satisfied, the circuit is said to pass timing verification.

If the circuit fails timing verification, the timing verifier will report the critical paths that failed. This indicates that either the logic on the slow paths needs to be redesigned to be faster, or the clock frequency needs to be slowed down to accommodate the timing of the circuit.

Timing verifiers operate on one of two general paradigms: dynamic or static.

In dynamic timing verification, the circuit design is simulated through time. The engineer must determine model input stimuli with which to drive the circuit model, called test vectors. Applying dynamic timing verification to the sample circuit of FIG. 1, the timing verifier would successively apply twelve stimuli where either A or B or both undergo transitions: AB→AB={00→01, 00→10, 00→11, 01→00, 01→10, 01→11, 10→00, 10→01, 10→11, 11→00, 11→01, 11→10} and run a loop to simulate time, during which model clock $Ck_A/Ck_B$ would undergo several transitions. The circuit model would be operated through time to see at what time signals Y and Z stabilize. Dynamic timing verification is effective in that it is capable of diagnosing all timing problems, at least for the test vectors applied. But in modern circuit designs, the super-exponential combinatorics on tens of thousands of signals is fatal to the dynamic approach: there simply isn't time for a program to test all possible combinations of inputs (most of which would never arise in actual operation), nor for a human to filter out a set of meaningful test vectors that will test all the effective paths.

In the second paradigm, static analysis, there is no loop simulating the passage of time. Static analysis is to dynamic analysis as theorem proving is to case analysis: instead of attempting to simulate a "large enough" number of specific cases, a static timing verifier "reasons" about the circuit model and draws inferences about whether the circuit will meet its timing constraints. This generally involves analyzing every node—i.e., every wire—in a circuit and calculating transition times based on the arrival time of inputs and the propagation delay through the structures. As the times of the transitions of the inputs to a node are analyzed, only the latest transition (in time) is saved, and the algorithm immediately stops tracing any path that is known not to be the worst case. This process, called information pruning, is required to keep the program execution times reasonable.

One known algorithm for static timing verification is a depth-first search (DFS) of the circuit starting at each signal guaranteed on a clock edge, labelling each node with the currently best-locally-known worst-case timing information. After all nodes have been labelled, a second pass examines all timing constraints to tell the designer whether the circuit as a whole meets its timing constraints.

Consider the circuit of FIG. 3, in which a first stage of the circuit has two paths of different delay times, which join at a multiplexer, whose output is captured in a latch. The output of the multiplexer fans out in a second stage of two paths of different delay times, which are joined at a second multiplexer. The DFS algorithm represents each node of a circuit by a data structure as shown in FIG. 4. The node has a name, a "worst case arrival time," and a pointer to the node that drove this worst-case transition.

FIGS. 5a–5e depict a DFS analysis of the circuit of FIG. 3: FIG. 5a shows a time-sequence of stack states, and FIGS. 5b–5e show a time sequence of states of data structures.

In the DFS algorithm, the graph of the nodes of the circuit is walked in a depth-first order. The algorithm's walker maintains a current "arrival time," and a stack of nodes. (Since this is a static analyzer, note that the "arrival time" does not "tick" off time incrementally, it moves forward and back by the discrete amounts of delay of the logic walked.) The DFS walker pushes nodes onto the stack as it traces paths downstream, and pops them as it unwinds back upstream. The walker increments its arrival time as it walks downstream through logic by the time delay of the logic, and decrements it the same amount as it unwinds back. As the algorithm pushes each node, if the walker's arrival time is later than the current "worst case arrival time" (or simply ".time") of the node, then the node is updated with the value of the DFS arrival time, and the node's "worst case predecessor" (or simply ".predecessor") is pointed at the predecessor node down which the DFS walk came, and the DFS continues down the successor nodes. If the DFS arrival time is equal to or earlier than the current node's worst case arrival time, the probe of this path is abandoned, and the node is popped off the stack.

In FIG. 5a, each column depicts a step 300 identified by number, and the value of the DFS arrival time 302 during that step. The state of the DFS stack 304 is also shown, with the top of the stack in bold. The term "labelled" is used to describe information permanently (though overwritably) stored in the representation of the circuit. "Unvisited" is used in a local sense: a node is unvisited if it has not been visited via the current path, even if it has been previously visited via a different path.

step 1: The algorithm begins a probe at a latch, in this case latch $L_y$, at a time that is assumed, without loss of generality, to begin at 1.

step 2: FIG. 5b shows the configuration of the nodes for the circuit of FIG. 3 as the algorithm visits the first node of the circuit, node A 310. All the node names have been filled in. A.predecessor and A.time have been filled in (by the process about to be described in detail).

step 3: Assume that A's list of successor nodes is ordered such that the algorithm visits C, then B. Thus, the algorithm walks to node C. Since the logic connecting A to C, $CL_2$, consumes 11 ns, the DFS algorithm carries the arrival time 12 as it arrives at C. The algorithm, finding C not already labelled, labels C.time with 12 and points C.predecessor to A.

step 4: The only successor of C is D, through logic consuming 1 ns, so the algorithm proceeds to D and sets D.time 13 and points D.predecessor to C. Assume that D's list of successor nodes is ordered such that the algorithm visits node E, then F.

step 5: Node E is filled in with time 26 and predecessor D.

step 6: Node G is filled in with time 29 and predecessor E. The walk would continues downstream from node G.

step 7: Assume that clock $\phi_w$ will open latch $L_w$ at a time later than 33; thus this latch is still closed, and the DFS probe blocks.

The intermediate state after step 7 is shown in FIG. 5c. The "worst-case arrival times" 322 have been filled in with a preliminary estimate of the latest transition time. The .predecessor pointers 320 show a preliminary estimate of the critical path to G, $L_y$-A-C-D-E-G.

step 8: DFS pops its stack back to G. G has no unvisited successors.

step 9: DFS pops its stack to back E. E has no unvisited successors.

step 10: DFS pops its stack back to D. D has an unvisited successor, F.

step 11: Node F is filled in with time 32 and predecessor D.

step 12: When DFS arrives at node G with arrival time 33, it finds the node already labelled, but with a time earlier than the current DFS arrival time. Thus, G is updated with time 33, and G.predecessor is updated to point to node F. Note that pointing G.predecessor from E to F "prunes" from the graph all analysis downstream of E that was computed between steps 5 and 6. The algorithm has proved that E cannot possibly be on the critical path to G nor any node downstream of G. Because G has been relabelled, the nodes downstream of G must be walked again to have their times updated.

step 13: Latch $L_w$ is still closed, and the DFS probe blocks. The intermediate state after step 13 is shown in FIG. 5d.

step 14: DFS pops its stack back to node G.

step 15: DFS pops its stack back to node F.

step 16: DFS pops its stack back to node D. D has no unvisited successors.

step 17: DFS pops its stack back to node C.

step 18: DFS pops its stack back to node A. The next unvisited successor of A is B.

step 19: B is labelled with time 8 and predecessor A.

step 20: DFS arrives at node D with arrival time 9. The arrival time is earlier than the current time of node D; thus, the algorithm stops probing along this path: all paths downstream of node D through node B are also said to be "pruned." By the same reasoning used in step 12, the algorithm has proved that the critical path to all nodes downstream of D must pass through C, not B.

step 21: DFS pops its stack back to node B.

step 22: DFS pops its stack back to node A. Node A now has no unvisited successors.

step 23: DFS pops its stack back to $L_w$.

Finding no unvisited successors of $L_w$, the DFS algorithm is complete. The result of the algorithm is the critical path graph of FIG. 5e. For instance, the critical path to node G can be discovered by tracing the .predecessor pointers from a node; e.g., the critical path to G is seen to be $L_y$-A-C-D-F-G. The critical path graph will be of the form of a forest of trees, each tree rooted at one of the input nodes or interior latches. Paths B–D and E–G have been pruned; no larger path that would have used these paths will be analyzed.

There may be multiple critical path graphs built for a single circuit, for instance one for a rising clock edge and one for a falling edge. Each node will have at most a single out-edge pointing to the latest-transitioning driver node for the given clock edge (or to one of several equallylate transitioning). The critical path graphs superimpose without effect on each other. Without loss of generality, what follows will discuss single critical path graphs.

Once the timing verifier has identified the critical path to every node, the designer will redesign parts of the circuit to speed up the logic on the critical path, and then run the timing verifier again. If the designer successfully speeds up a structure on the critical path, subsequent runs of the timing verifier on the altered circuit will likely produce a different critical path graph.

In dynamic timing verification, the designer creates test vectors that exercise active, meaningful paths of the circuit. Static timing verification, by its nature, ignores the designer's logical intent and tests all paths through the circuit. The blessing of this more complete coverage is also a curse: unused, meaningless paths that will never be exercised during actual use of the circuit are also tested.

Existing timing verifiers for VLSI design are used almost exclusively for semi-custom circuitry. One reason that they have been impractical for full-custom ICs is that they are unable to cope with the myriad of possible latch designs that a full-custom IC may present.

Semi-custom ICs are built around the concept of a cell library—a fairly small number of cells, constructed beforehand. These cells are then reused and replicated, just as a mason might create interesting patterns in a brick walkway using only a handful of different types of bricks. The advantage of this cell-library scheme is its short time to market. Since a semi-custom circuit design uses relatively few (on the order of one hundred) cells, and since the replication of a cell takes far less work than its original creation, the work involved in chip design is vastly reduced. However, since no small set of cells can exactly meet the needs of every individual situation, the performance of this type of design is limited.

A full-custom IC design methodology removes this restriction. While standard cells may be used in most of the IC, a designer is free to use hand-tailored circuitry in his most critical design sections.

Known timing verifiers subscribe to a notion that a circuit consists of combinatorial logic and latches: for instance, in the analysis of FIGS. 1 and 2, the depth-first walk would stop at latches 132 and 134, or in FIGS. 3 and 5, the depth-first walk would stop at the first latch downstream of node G. Thus, if the input to the timing verifier is a device-level wirelist rather than a gate- and latch-level block diagram, the timing verifier must identify the latches in the circuit model. When the design is constrained to the blocks of a semi-custom cell library, there may be only, e.g., five types of latches, and thus it is easy for a template-matcher to reassemble the wirelist-level devices into block-level latches when closely tuned to a particular circuit-design methodology, this template matching approach can work quite well. In a second method, the latch cells of the schematic-capture editor have a "latch" attribute bit. When the editor produces a wirelist, the wirelist includes a "dotted line" annotating the inputs, outputs, and elements of the latch.

In full-custom circuitry the clocking circuitry may be more complex than allowed in semi-custom designs. One reason is the existence of logic families (e.g., CVSL, cascode voltage switched logic, developed by IBM) where arbitrary combinatorial logic may be embedded in a latch. The number of combinatorial functions rises exponentially with the number of function inputs, so the number of possible latch types grows into the thousands or tens of thousands very quickly. Of course, in any given design, limited human resources prevent more than a few hundred of these from being used.

Although in semi-custom circuits, clock enable signals are typically required to be set up before their clocks activate, in full-custom designs such as domino logic families, a clock enable may legally transition in the middle of a clock phase. The "latch" derived by the analyzer would include everything from the clock conditioning gate to the tristate inverter output of the latch. The amount of circuitry between may be very large.

SUMMARY OF THE INVENTION

The invention makes it possible to accomplish effective timing verification even on full-custom circuits in which there may be so many different kinds of latches that using a timing verifier based on a latch concept would be impractical.

The invention recognizes that circuit elements in a VLSI circuit embody two fundamental concepts, two conceptual primitives: synchronization points and timing constraints.

Synchronization points reflect the ability of a device to synchronize a data signal with a clock signal: any data signal arriving at an input to the latch must wait until the latch turns on. A device may have a synchronizer for each of its inputs. A synchronizer for device M at input N forms, for each clock phase $\phi_x$, a "blockpoint" that only allows transitions on N to propagate through M during $\phi_x$. Simple gate-level examples include flow-through latches and clock-qualification gates (FIGS. 6, 7a–7b, and 8a–8j). Synchronizers may also appear at other places that are not traditionally within so-called "latches"—e.g., any point where a datum is effectively ANDed with a clock, such has a clock-qualification gate, or even the discharge piece of a precharge-discharge structure.

A synchronizer is very much like a traffic light: if a car/signal arrives at an intersection/device M from direction/input N during a phase in which the traffic light/synchronizer is green/on, the car/signal is allowed to proceed straight through, delayed by the transit time through the intersection/device. If the car/signal arrives during a phase when the synchronizer is red/off, then the car/signal must wait until the next green/on phase.

The second fundamental concept is a device's enforcement of timing constraints—if setup and hold constraints are not met, then the circuit does not function properly. In a full-custom environment, other circuits than latches may have timing constraints—for example, in a gated-clock circuit associated with a state or memory structure, the enable must be negated before the clock is asserted.

Known timing verifiers have treated synchronization of data and enforcement of timing constraints as a single indivisible concept, named "latch."

In the invention, a timing verifier dispenses with the concept of "latch" and instead determines the points in the circuit that impose synchronizations or timing constraints. The verifier then annotates the circuit model with the synchronizations and timing constraints, and analyzes the circuit with respect to them. The timing verifier need not rely on the schematic capture editor to annotate latches, nor need it determine what devices of a circuit form a latch.

Thus, in general, in one aspect, the invention features a computer-based method for improving a design of a circuit through analysis of a computer stored model of the circuit. Individual synchronization points are identified in the circuit at each of which a signal may be blocked or allowed to pass in response to appearance of a second signal at the synchronization point. The timing of the circuit is verified based on the individual synchronization points.

Embodiments of the invention include the following features. Signal paths interconnecting synchronization points are also identified in the circuit. The verification process includes determining the timings of hypothetical signals which are propagated along the signal paths and passed by the individual synchronization points.

Individual timing constraints are also identified in the circuit each of which represents a required relative time sequence of occurrence of two signals in the circuit. The timing of the circuit is verified also based on the individual timing constraints.

In some embodiments, a wirelist representation of the circuit is received at the computer, and the wirelist representation is parsed to create the model. The model is annotated with timing information based on the individual synchronization points, and the individual timing constraints are evaluated based on the timing information. At least some of the individual timing constraints are identified by computer analysis of the model, and comprise complete-swing constraints, or glitch-based constraints. At least some of the individual timing constraints require a relative order of transitions of two signals of the circuit.

The identifying of the individual synchronization points may include a subset analysis. The model comprises a device-level model. The identifying of at least some of the individual synchronization points is accomplished independent of any identification of a portion of the circuit as a latch. The circuit comprises conditional clock signals, and the individual synchronization points are identified relative to the conditional clock signals. The individual synchronization points distinguish the signals that may be blocked from those that may be allowed to pass based on their values.

The individual synchronization points are identified for gate inputs and source inputs of devices of the circuits. The timing constraints are identified under at least one of the following assumptions: (1) analog effects within the circuit can be modelled as worst-case digital effects, (2) the individual synchronization points can be derived based on specified interactions between channel-connected regions of the circuit, and (3) transitivity holds within any single channel-connected region of the circuit.

The individual synchronization points may be identified based on a minterm description of the circuit, and the minterms may be derived by an enumerative evaluation of inputs to a portion of the circuit.

In general, in another aspect, the invention features a computer executable program for improving a design of a circuit through analysis of a computer stored model of the circuit, the program comprising modules to perform the steps of the analysis described above.

A timing verifier using the invention has the following advantages. Full-custom integrated circuits may be designed using custom latches as the designer wills, and the timing verifier will be able to analyze the circuit. A timing verifier using the invention need not be "taught" about all latch types that the designer contemplates using. The method of the invention avoids a combinatorial explosion in computation space and time that previous methods have required. Circuits that have synchronizations or timing constraints not at latches will be correctly analyzed.

Other advantages and features of the invention will become apparent from the following description of a preferred embodiment, and from the claims.

BRIEF DESCRIPTION OF THE DRAWING

FIGS. 5a–5e illustrate a time sequence of states during timing verification.

FIGS. 10A–10B and 11A–11D present pseudocode for two passes of a timing verifier incorporating the invention.

FIGS. 12 and 13 present equations used in proving the correctness of the synchronization algorithm.

DESCRIPTION

The invention has been implemented as a modification to NTV, a timing verifier in internal use at Digital Equipment Corporation. NTV is written in the C and PL/I languages, and is described in "Timing Verification on a 1.2M-Device Full-Custom CMOS Design" by Jengwei Pan, Larry Biro, Joel Grodstein, Bill Grundmann, and Yao-Tsung Yen, published in the proceedings of "DAC 91", the ACM/IEEE Design Automation Conference, June 1991, incorporated herein by reference. The implementation of the invention centers in improvements to the data structures, and modifications to the several passes of the analysis.

A user of NTV need not do anything to "turn the feature on," though, as discussed below, the user may provide directives to NTV to assist NTV's analysis of the circuit model.

The invention alters the way NTV internally looks at circuits. Thus, if NTV finds no timing violations, the user will not even know that the invention is being used—except for the reduced time required for NTV to report its result. If NTV does report errors, then they are reported in terms of the underlying conceptual primitives, the synchronizers and timing constraints, rather than in terms of latches.

Figure 1:
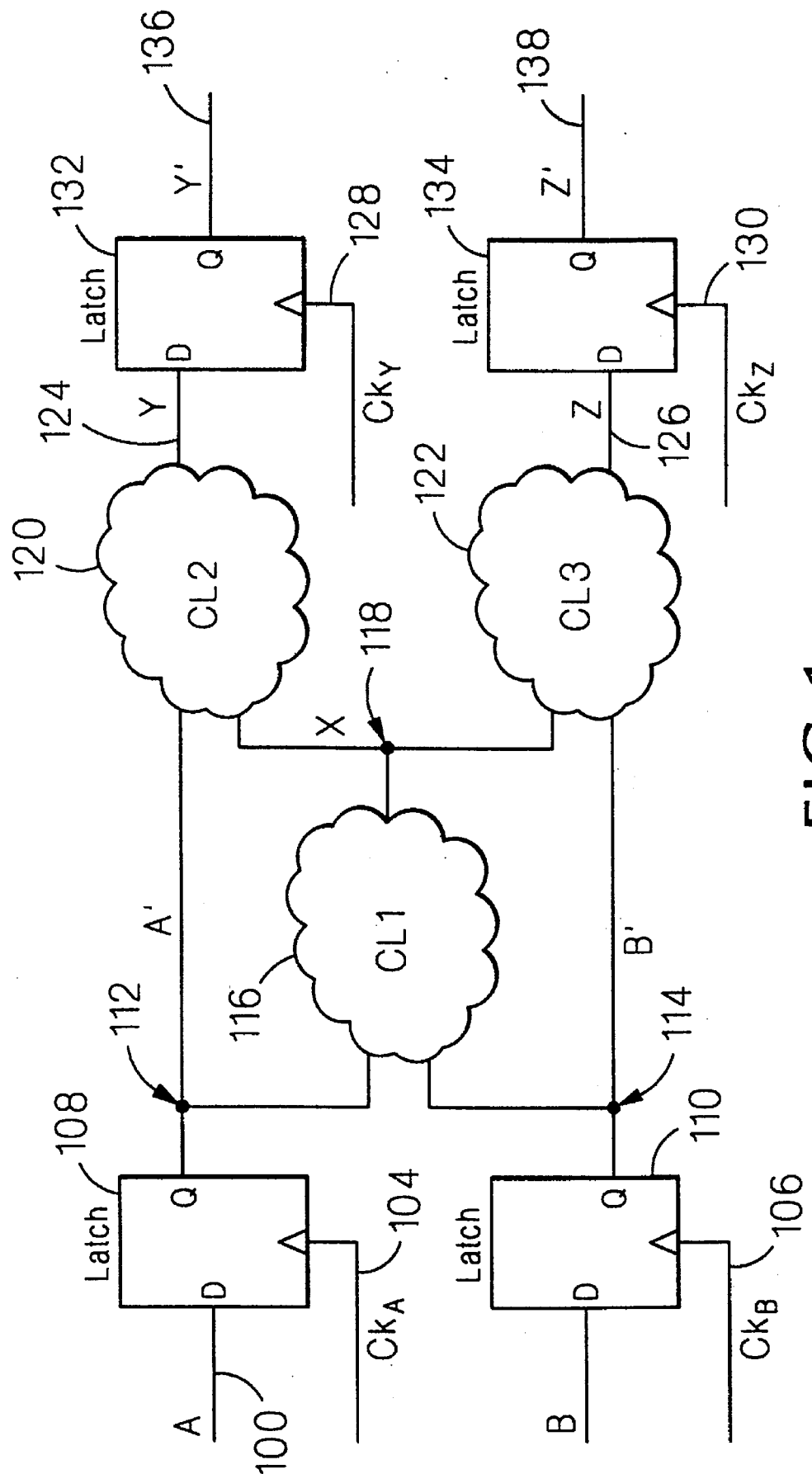
FIG. 1 is a schematic diagram of a hypothetical circuit.
Figure 2:
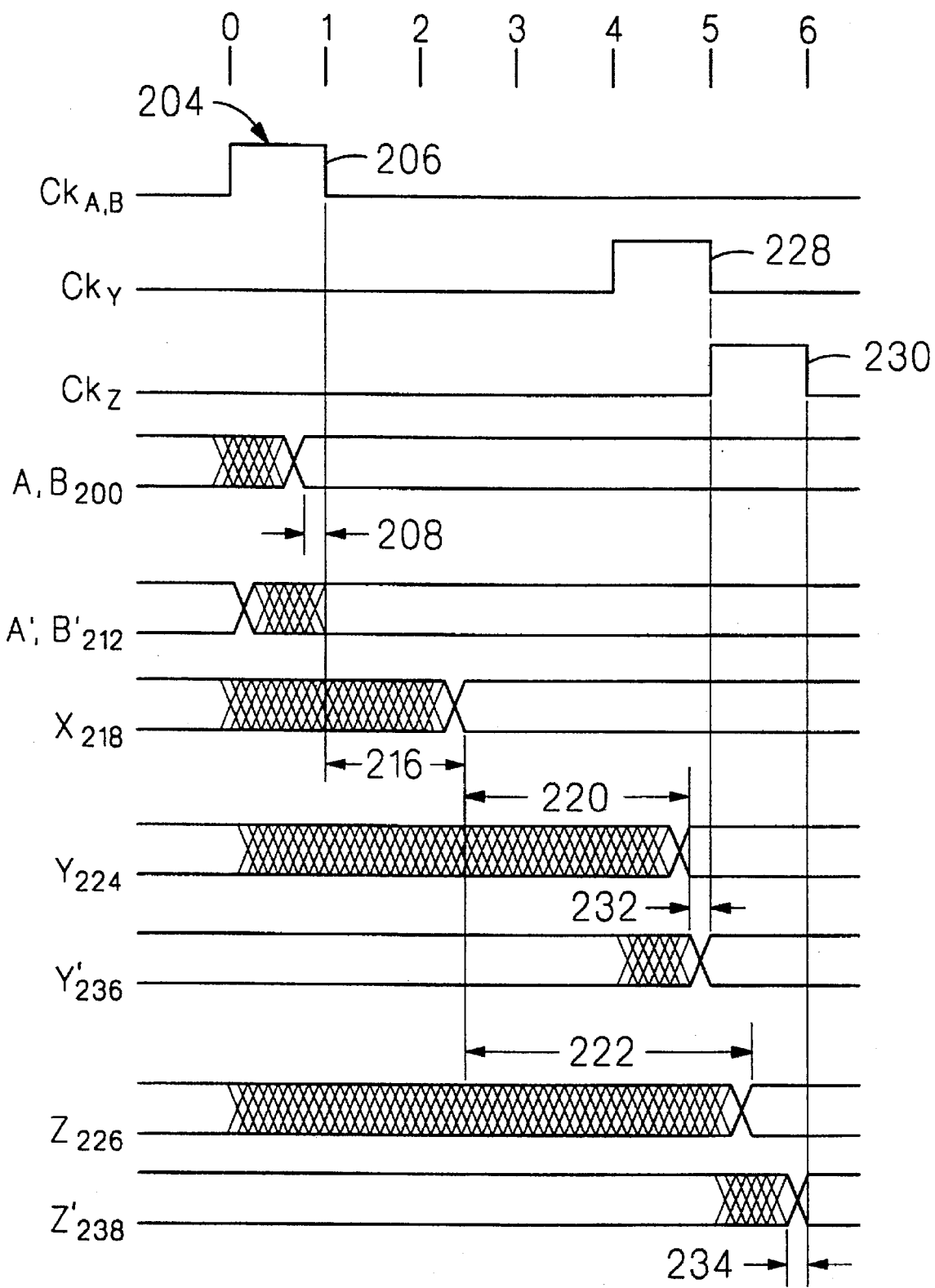
FIG. 2 is a timing diagram for the circuit of FIG. 1.
Figures 3, 4:
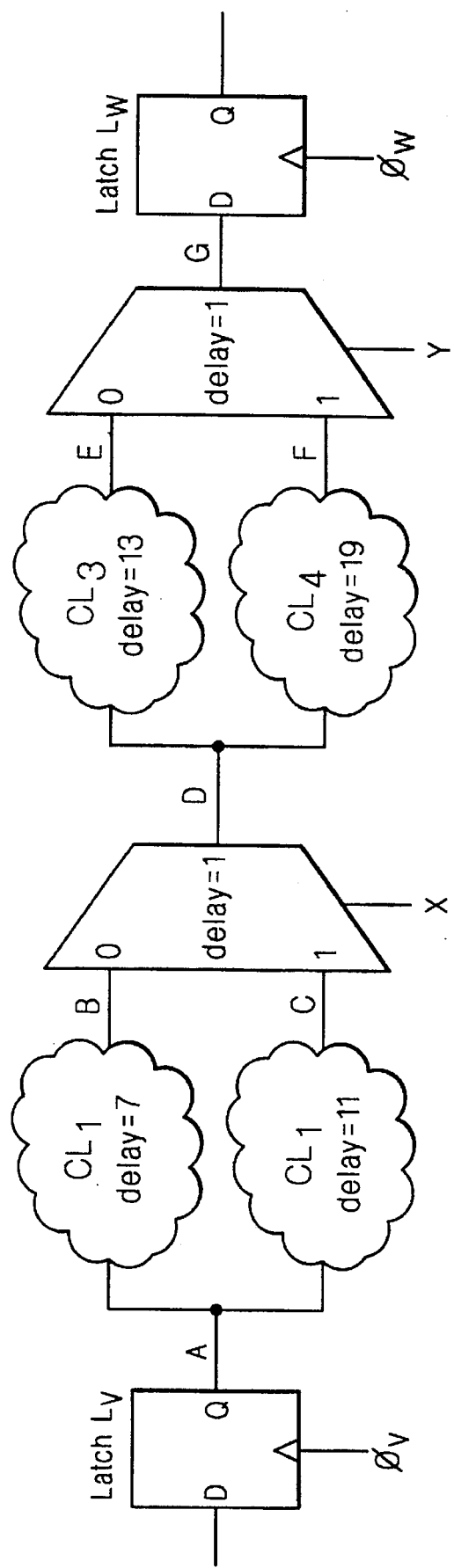
FIG. 3 is a schematic diagram of a hypothetical circuit.
FIG. 4 is a data structure diagram.
Figure 5D:
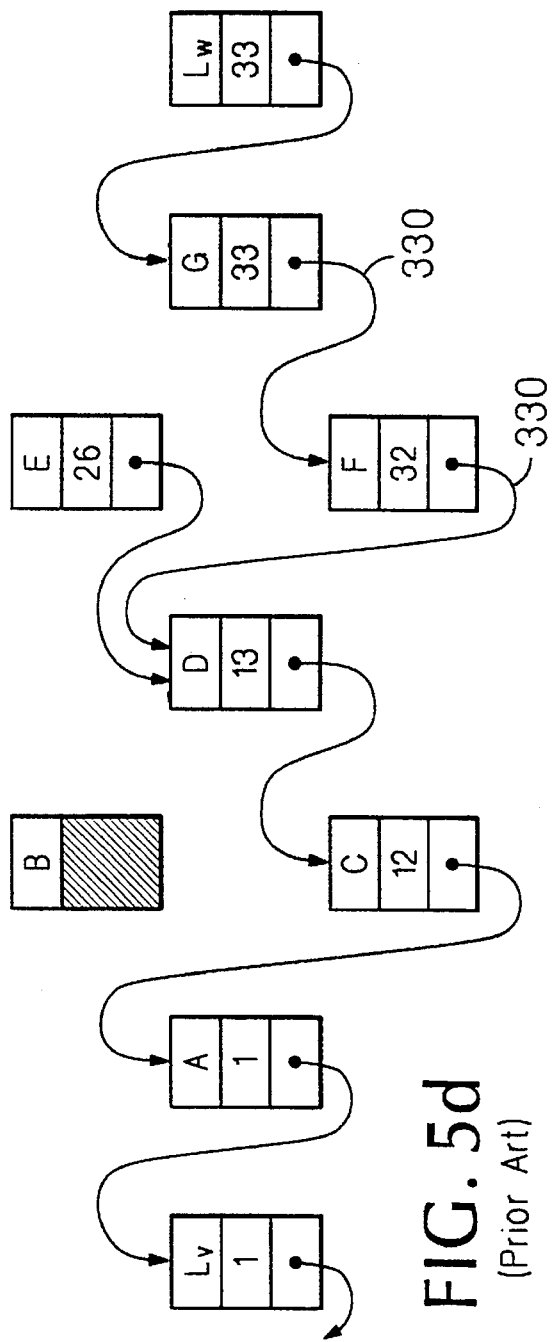
Figure 5E:
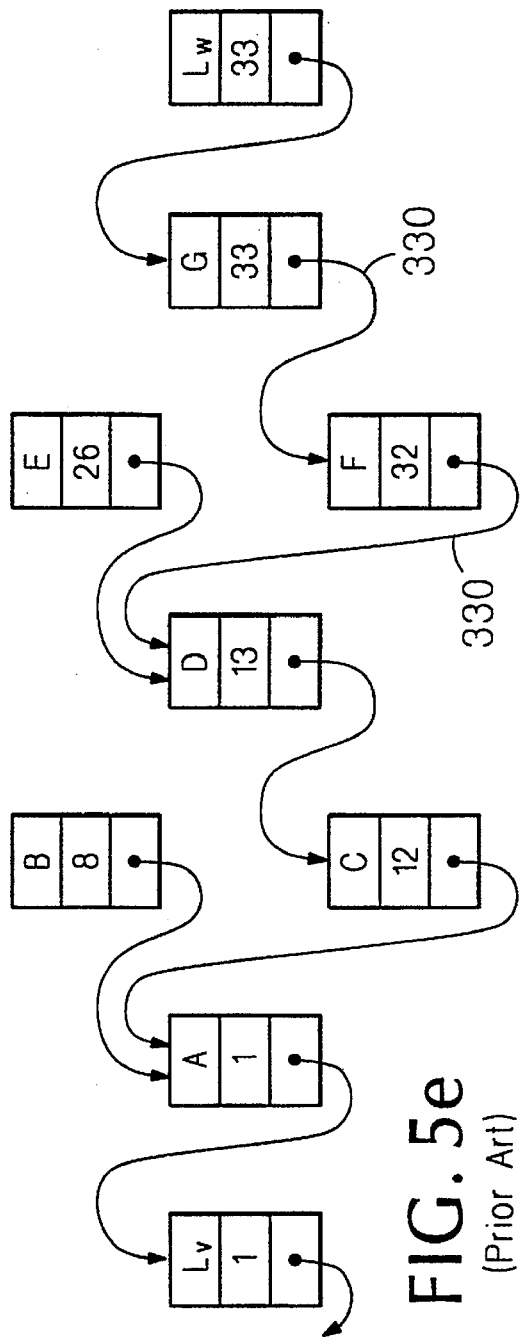
Figure 6:
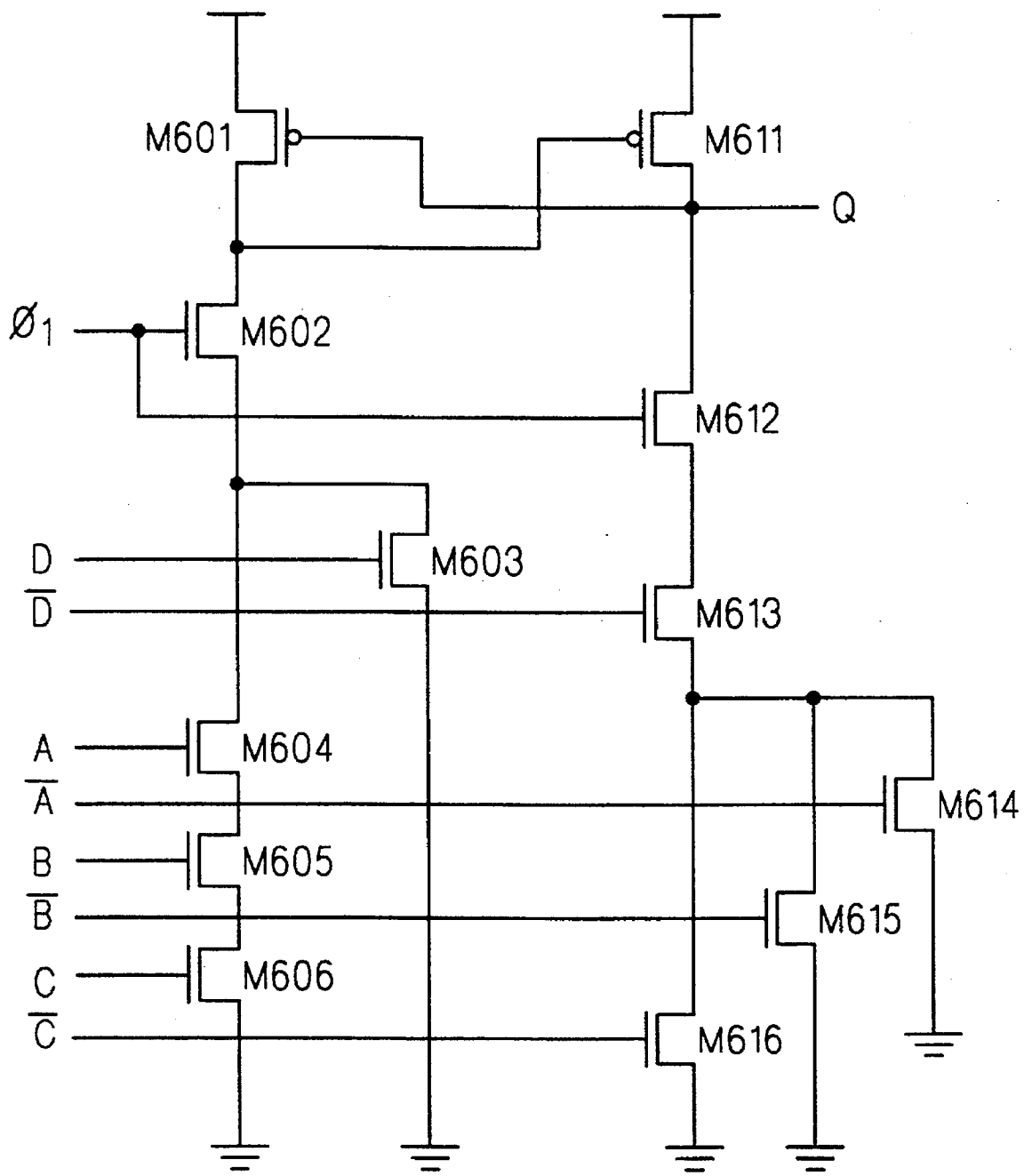
FIGS. 6, 7a–b, 8a–8j, and 9a–9f are circuit schematics.

Consider the example of FIG. 6, a CVSL circuit performing the function:

if (clock=1)

then Q=ABC+D else Q=Qold

In a traditional timing verifier, this entire structure would be viewed as a level-sensitive latch. However, it can also be viewed as a collection of synchronizers and timing constraints. From this viewpoint, signals A, B, C and D are synchronized to clock $\phi_1$—i.e., transitions on A, B, C, and D cannot reach Q until $\phi_1$ is high.

Furthermore, this circuit must obey the two timing constraints that "any rising transition on Q must complete before the trailing edge of $\phi_1$," and "any falling transition on Q must complete before the trailing edge of $\phi_1$," or else the circuit may produce improper voltage levels.

Figure 7A:
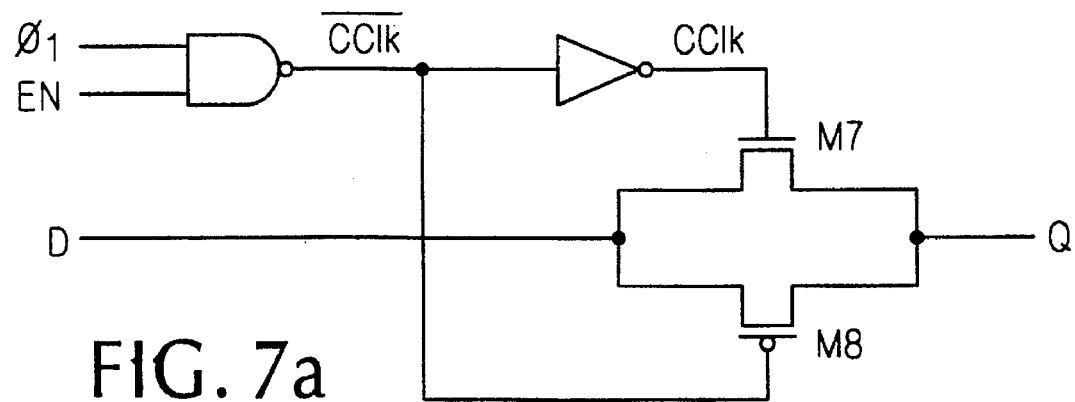
Figure 7B:
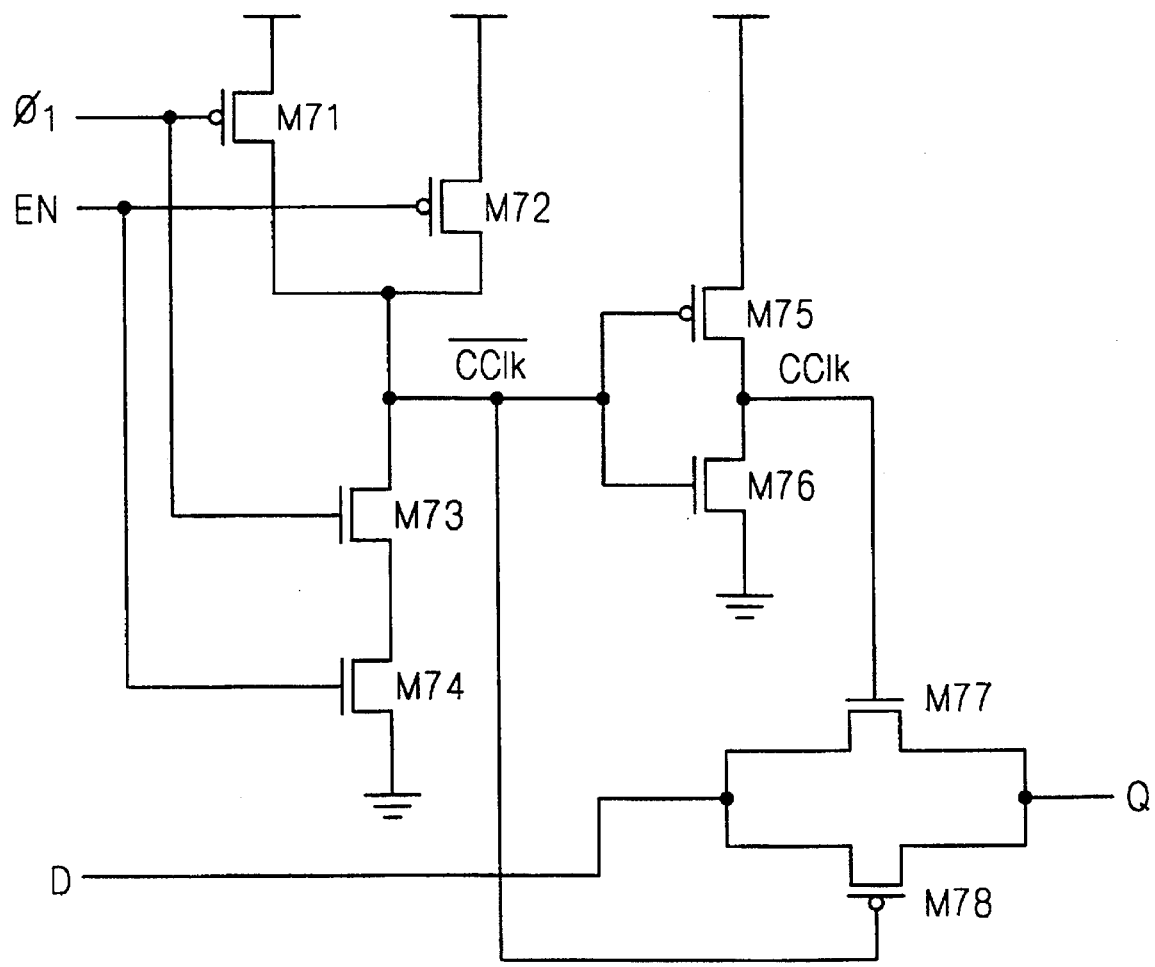

In another example, shown in a gate-latch block diagram in FIG. 7a and the device level in FIG. 7b, the enable signal EN enables conditional clock CClk, which gates a latch. The function of this circuit is

```
if (φ₁ and EN)

then Q=D else Q=Qold
```

In this circuit, when EN falls (i.e. is negated), it must do so before $\phi_1$ rises. This constraint on EN is derived from the latch at Q, and is only valid because of this latch. That is, were the latch at Q to be removed or replaced with a simple gate, the constraint on EN would vanish. A timing verifier based on latches would place this entire circuit into one latch, which would then likely be a new latch type.

Instead, we merely recognize that this circuit a) performs synchronization in two places—EN is synchronized to phase 1 by clock $\phi_1$, and D is synchronized to phase 1 by CClk.

b) has timing constraints—the mentioned constraint on EN, and two more constraints on Q: "any rising transition on Q must complete before CClk falls" and "any falling transition on Q must complete before CClk falls"

NTV propagates timings based on synchronizers and verifies that the timing constraints are met, without ever analyzing the circuits to find a "latch". Indeed, NTV has no "latch" data structure. Instead, NTV has a data structure entity called "synchronizer" and one called "timing constraint". All of NTV's algorithms are based purely on these two simple data-structure entities. NTV avoids the need to categorize myriad different latch types by organizing its data structures so as to avoid "latch" entities altogether.

Figure 14:
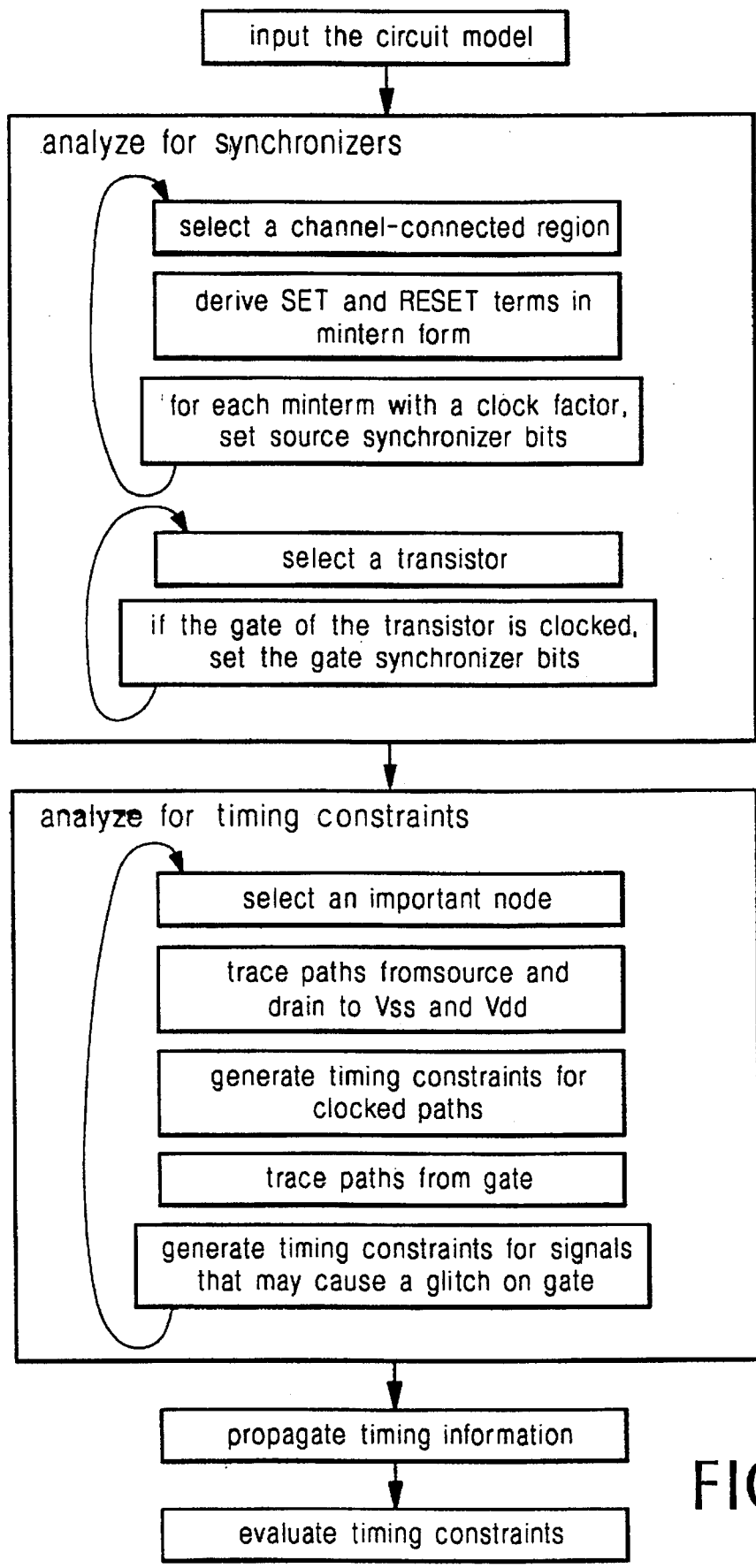
FIG. 14 is a block diagram of a timing verifier incorporating the invention.

NTV runs in four major passes, shown in FIG. 14. After the circuit model is read in and annotated with information from a user data file, pass one determines and annotates the circuit model with synchronizers. In pass two, NTV determines and annotates the circuit model with timing constraints. Pass three is analogous to the depth-first node timing propagation discussed in the background, and uses the synchronizers from pass one to bound the depth-first search. (Passes one, two and three can run in any order, as long as synchronizers, NTV's pass one, is before timing propagation, pass three.) In pass four, the timing constraints introduced in pass two are evaluated against the worst-case timings generated in pass three, and violations are reported.

A synchronization bit is a boolean value specified by the tuple (device, input pin, phase). The "input pin" can be the gate or source pin of a MOS transistor. The synchronization bits for the gate input pin are further discriminated to indicate whether the transistor can pass a one (Vdd) one (Vdd) or pass a zero (Vss) from source to drain during the phase. The data structures for the synchronizer bits of a device are bit vectors embedded in the struct for a device, as shown in Table 1.

TABLE 1 synchronizer data structure

```
/* MOS device data record */
struct device_rec {
    ...
    unsigned    gate_pass_one_mask: K$NUM_PHASES_MAX;
    unsigned    gate_pass_zero_mask: K$NUM_PHASES_MAX;
    unsigned    source_pass_mask: K$NUM_PHASES_MAX;
    ...
};
```

A timing constraint is a property of a node. The timing constraint may be either a node-relative rule, for instance "any rising transition on node P must complete before node Q falls," or a clock-absolute rule, for instance "any falling transition on R must complete before $\phi_2$+2ns" Excerpts of the data structure for a timing constraint is shown in Table 2.

TABLE 2 data structure for a timing constraint

```
struct timing_check {
    struct node    *checked_node;
        /* the node which this timing_check annotates */
    boolean         checked_rising;
        /* if true, then the node is checked for a rising
        ** transition; if false then a falling xition */
    check_type type;
        /* node-relative vs. clock-absolute */
    union   {
        struct   {    /* reference node, rising/falling */
            struct node    *ref_node;
            boolean         ref_rising;
        };
        int    absolute_time;
    };
    struct timing_check *next;    /* linked list */
};
```

Timing constraints have been used in known timing verifiers. The timing constraints of NTV are somewhat different than these known timing constraints, both in content and in how they are calculated. Known timing verifiers have either required the user to enter timing constraints or have derived timing constraints for gate/latch-level circuit models. NTV determines timing constraints for device-level circuit models. Timing constraints in known timing verifiers are expressed in terms of the setup and hold times for the latches, either relative to the absolute clock or other transitions; NTV timing constraints constrain a signal transition against a fixed time reference or constrain two signal transitions relative to each other.

Pass one: synchronizers.

NTV implements algorithms that derive synchronization points in a provably robust manner. NTV classifies circuits as to their functions: not based on simple pattern recognition of specific structures, but rather by an underlying theory of how MOS devices combine to perform synchronization.

Recall that there is a synchronization bit for each tuple of (device, input pin, phase) in the circuit. When this bit is on, any change at "input pin" during "phase" is allowed to propagate through "device" immediately. If the bit is off, the change in the input is blocked until the next phase in which the bit is on. A "synchronizer" is said to exist at a device when one or more bits on an input pin are on, and one or more are off. The meaning of this configuration is that a signal arriving at the input pin during a phase corresponding to one of the off bits will not affect the output of the device until the next phase corresponding to an on bit.

Figure 8A:
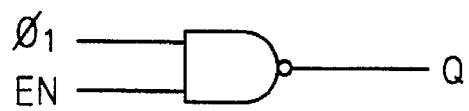
Figure 8B:
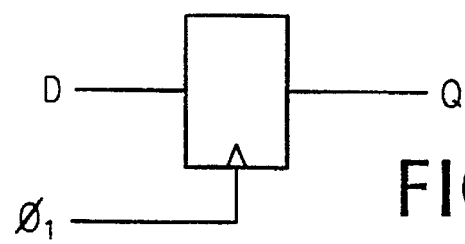

FIGS. 8a and 8b show two simple cases. In FIG. 8a, EN is synchronized to clock $\phi_1$ by the clock qualification gate. At the EN input, the phase 1 bit will be on, and all others off. In FIG. 8b, D is synchronized to clock $\phi_1$ by the latch. At the D input (the D inputs to the devices internal to the latch), the phase 1 bit will be on, and all others off. During timing verification, any path that arrives at the gate or latch during phase 1 will continue to propagate through the circuit, and any path that arrives at any other time will be abandoned. If EN falls during phase 2 before $\phi_1$ does, then $\phi_1$ falling produces the latest possible phase 2 transition on Q. Interestingly, this is still the case even if $\phi_1$ falls before EN: i.e., $\phi_1$ falling is unconditional, and once Q has risen unconditionally, no later transition is even statically possible. Thus, since no change on EN in phase 2 can produce the latest change on Q, it is meaningful to say that EN is blocked during phase 2. In other words, the conditional transition on EN in phase 2 is a proper subset of—and hence masked by—unconditional transition.

The cases of FIGS. 8a and 8b could be handled by a fairly naive implementation of synchronizers, an implementation analogous to standard boolean difference fault analysis. However, correct timing verification of the more complex circuits of FIGS. 8c–8i requires the more fundamental concept of subsetting. NTV relies on two subsetting notions. In the first, if there are two transitions on the same node during the same phase, one conditional and the second unconditional, the conditional transition is said to be a subset of the unconditional transition. In the second subsetting notion, called "subsetting in time", a transition in phases $\phi_x$ or $\phi_y$ is said to be a subset of a transition in phases $\phi_x$, $\phi_y$ or $\phi_z$. Thus, once a synchronization point has been analyzed for one set of transitions, it's pointless to analyze the circuit for another transition that is a subset of the first.

The advantage to subsetting is that it allows NTV to trace a set of transitions that is closer to the set of transitions that are actually possible in the functioning circuit. A timing verifier can err in one of two directions: either it can propagate spurious model transitions that cannot actually occur in the physical circuit, and thus report "noise" timing violations, or it can choose to not propagate model transitions that it cannot prove to be inevitable in the physical circuit, and thus possibly overlook real timing violations. NTV takes the former approach, always erring on the side of safety and over-analyzing a circuit, but using algorithms that minimize the excess. Subset theory is useful because is accurately predicts when a transition is to be propagated and when it is not to be propagated.

Figure 8C:
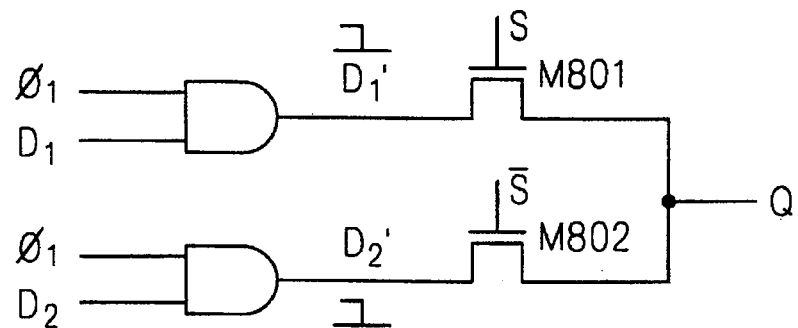

Referring to FIG. 8c, both Di' and D2' are known to be low during phase 2, either because the designer has added this constraint to the model manually, or because a tool upstream of NTV has proved this. Thus, it is known that Q is low during phase 2, and so, by the concept of subsetting, S is synchronized to phase 1 at M801 and M802.

A transition that is itself unconditional, on the other hand, cannot be a proper subset of any other transition; it thus works well not to allow it to be blocked. The circuit of FIG. 8h is at first view quite paradoxical, but is resolved easily by this theory. The simple boolean difference theory would determine that $\phi_1 A$ can only pass M851 in phase 1, because it is blocked by $\phi_1 B$ otherwise. Likewise, $\phi_1 B$ could only pass M852 in phase 1. So how does Q rise in phase 2? Subsetting theory gives the answer: since unconditional transitions cannot be subsetted, there are (contrary to the simpler boolean difference theory) no synchronizers in this circuit. Therefore, all falling transitions on $\phi_1 A$ and $\phi_1 B$ pass through, raising Q in phase 2.

The concept extends to subsetting in time. In FIG. 8i, $\phi_{23}$ falls unconditionally in phase 4. This does not produce a rising transition on $\phi_2$ (through M861) in phase 4. $\phi_{12}$, being low in phases 3 and 4, forces $\phi_2$ unconditionally high in phases 3 and 4. Thus, the output node is guaranteed already low in phase 4, and the first path can safely be disregarded. Thus, even the unconditional transition in phase 4 is a subset in time of the other one. By, subsetting, the phase 4 transition on Q caused by $\phi_{23}$ falling is properly ignored. Hence, the P devices synchronize $\phi_{12}$ to phases 2-3-4 and $\phi_{23}$ to phases 1-2-3 and the correct transitions appear at $\phi_2$.

Figure 8D:
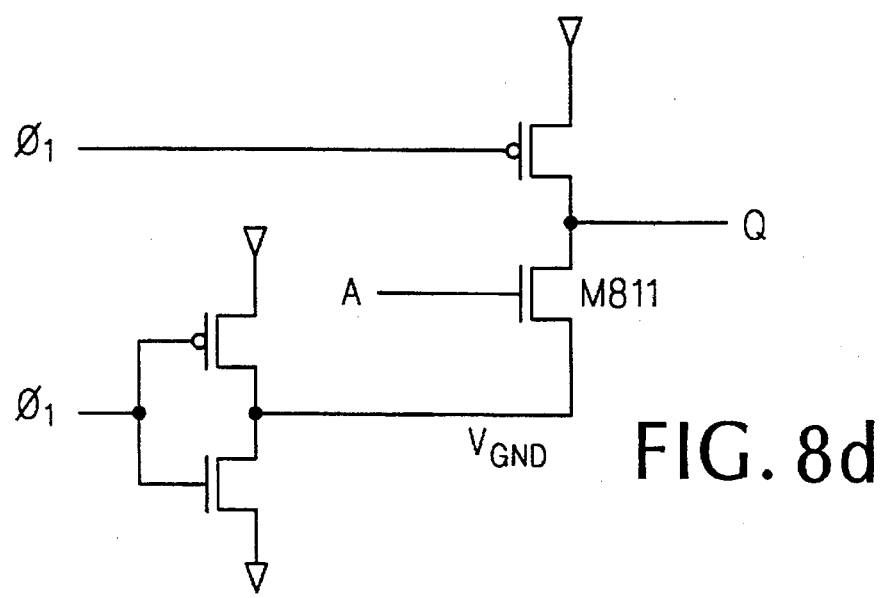

Referring to FIG. 8d, even though a path exists from $V_{dd}$ to Q through M811 in phases 2, 3, and 4, it is only an internal precharge. By subsetting theory, the conditional path through the internal precharge device is a subset of the main unconditional precharge path and is thus ignored. Then A is synchronized to phase 1.

The algorithm used in NTV to find synchronizers makes three simplifying assumptions:

α1. Analog effects can be ignored; a boolean model must apply.

α2. Synchronization points can be derived based purely on local information. Specifically, a group of devices interconnected by MOS channels (channel-connected region, or CCR) only interacts with other CCRs through a small set of simple constraints.

α3. Transitivity holds true within any single CCR. That is, if there is a signal path from A to B and one from B to C, then there is one from A to C.

These assumptions say that the CCR is a good unit to abstract away the analog and other difficulties of MOS design. Though none of them is true for a completely general network, α1, α2 and α3 allow a formal theory to be developed on a delimited class of networks, a large enough class to be useful in a timing verifier for large real circuits.

Consider first CCRs with only one input node. The CCR is abstracted into an equivalent RS flip flop, by methods discussed below (see the discussion of deriving SET and RESET terms). The simple four-phase example in FIG. 8j shows the reset term only. (Since the resulting equation is identically zero in phases 2, 3, and 4, the algorithm will place a $\phi_l$ synchronizer at the gate of M1.)

Once the SET and RESET terms are known, their sensitivity to each of their input must be determined. One method is to use standard fault detection techniques to determine their sensitivity to each of their inputs in each phase. Specifically, for any node N driving pin P of device M, and where M's effect output node is Q, the equations in FIG. 12 pertain.

The min function says that Q is sensitive to a change in N through device M. It precisely delineates circuitlevel synchronizers from gate-level synchronizers.

The subset-in-time operation says that unconditional transitions are not subject to simple boolean sensitivity. Like min, it is a circuit-level operator. It is true whenever another minterm exists that covers the current minterm over both the current and previous phases.

Separate treatment of S and R assures that, when either the set or the reset stack turns on, the transition is seen at the output. This is the normal behavior in ratioed circuits such as FIG. 8g, a P-static circuit, where the pullup is ratioed against the pulldown during phase 1. It is also the worst-case (most pessimistic) behavior for timing verification since, by definition, it allows the most transitions to propagate and be seen as critical paths.

The boolean difference gives sensitivity information. One common notation for boolean difference is analogous to partial derivatives:

$$\frac{\partial out}{\partial in}$$

expressing the change in the output relative to the change in the input—the partial derivative is non-zero only at points where the output is allowed to change. If there are no dependencies between inputs to the CCR, then the boolean difference extracts exactly those combinations of inputs other than N for which toggling N will result in a change in Q. If transitions on N are subsetted ("covered" in Karnaugh sense), the boolean difference will be identically zero.

The boolean difference operator is a partial derivative, and only applies when inputs to the function are independent.

That is, given $F_1(u,v)$ where $v=F_2(u)$, the equation of FIG. 13 pertains, by the boolean chain rule. By applying this chain rule differentiation to the SET and RESET terms, we could remove α2 (at a higher performance cost). NTV does not use this approach; it is too time-consuming. Instead, NTV enumeratively toggles individual function inputs to see if the output toggles: NTV searches the space of all other inputs to the node to see if there is a combination such that N=0 and N=1 produce different outputs. The code handles simple constraints, such as inverter folding and logical exclusivity (e.g., the control lines to a multiplexer) by never toggling to a disallowed combination.

The above results can be extended to CCRs with an arbitrary number of outputs. A node is defined to be important if (1) it is part of more than one CCR (this makes all CCR outputs important nodes), or it has both N and P source/drain connections on it (this conveniently makes all logic-gate output nodes important).

Figure 8E:
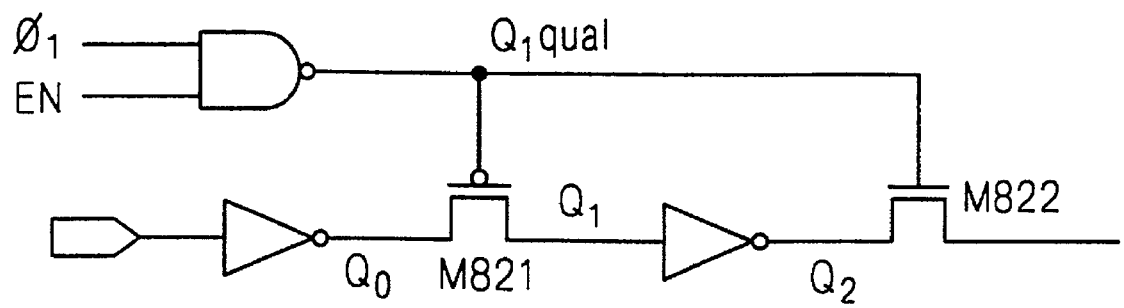

Referring to FIG. 8e, if node Q0 were not important then we could say that M821/M822's gates pass only in $\phi_1$—since any transition on Q0 in phases 2, 3, or 4 are not observable anywhere else. However, making Q0 important means that we must allow transitions from D to Q0 unobstructed, while still blocking them from reaching Q1. The only way to do this is to put a synchronizer at the source of M821.

In general, we can use simple graph-based techniques to split any single CCR into sub-CCRs, such that each important node is the output of exactly one sub-CCR. We can then treat each sub-CCR as a separate, single-output, region. A proof of this separability (and the rest of the theoretical underpinning for synchronizers and the synchronizer algorithm) is presented in "Automatic Detection of MOS Synchronizers for Timing Verification" by Joel Grodstein, Nick Rethman, Rahul Razdan, and Gabriel Bischoff, published in "ICCAD '91," the proceedings of the IEEE International Conference on Computer Aided Design, Santa Clara, Nov. 11–14 1991, available from the IEEE Computer Society Press, and incorporated herein by reference.

With this separation done, communication between sub-CCRs is handled via synchronizers placed at the source pins of their input devices. It is interesting to note that in some circuits (e.g. FIG. 8f), by making enough nodes important, we can overconstrain the problem such that no combination of source and gate synchronizers could represent the actual operation. By our preceding argument, such circuits must violate transitivity; and FIG. 8f, in fact, does.

Figure 8F:
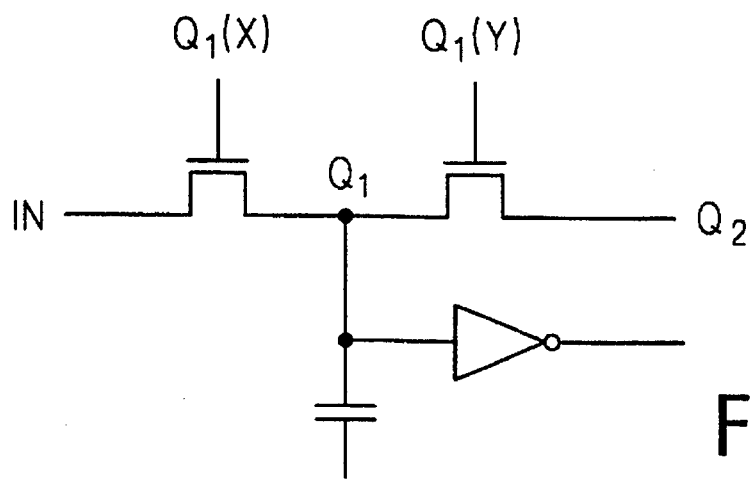
Figure 8G:
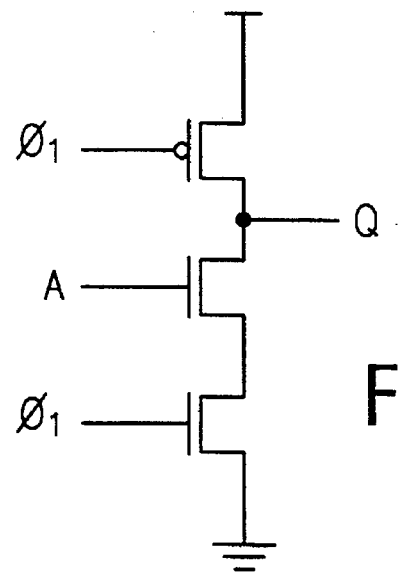
Figure 8H:
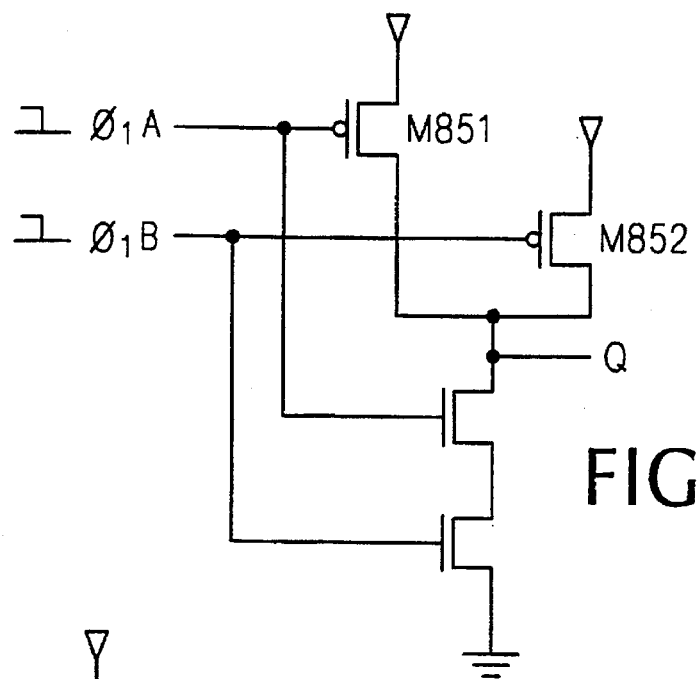
Figure 8I:
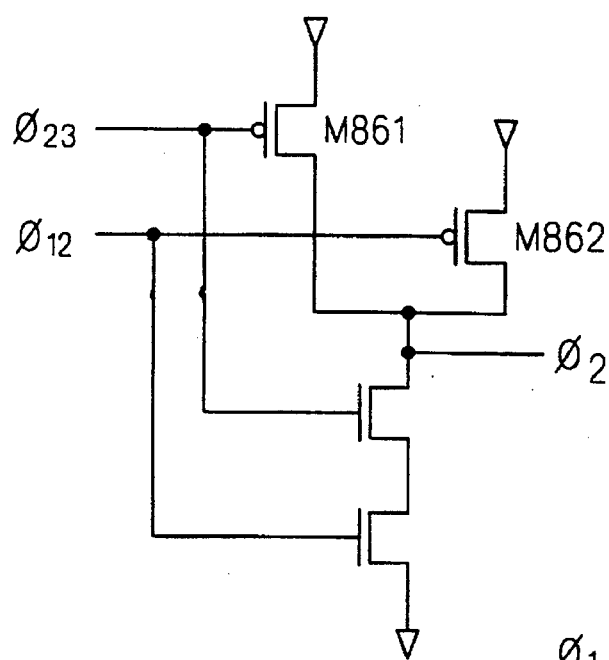
Figure 8J:
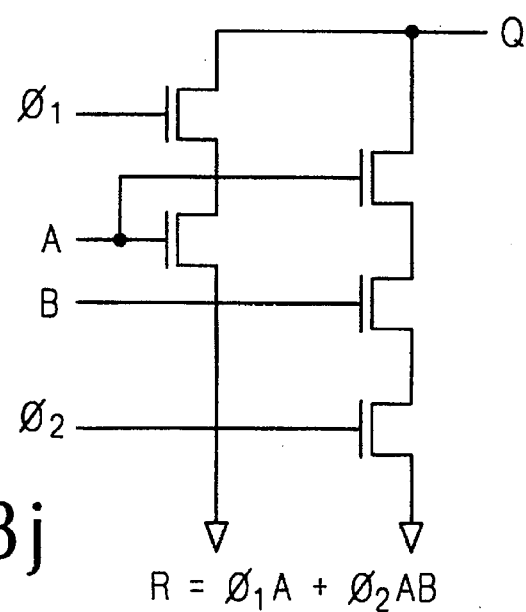

The quality of NTV's analysis is limited at points that violate assumptions α1, α2, and α3. For instance, sense-amplifier circuits violate e1. FIG. 8e violates α2 (the assumption that synchronization can be derived by local information). Since M821 is off in phase 1, there is no new data at M822's source. Thus, although $\phi_1$qual can be high in phase 1, data can only pass through MM822 in phases 2, 3, and 4 due to the global clocking. FIG. 8f violates α3, transitivity. This circuit operates by charge-sharing. Data flows from IN to Q1 in one cycle and from Q1 to Q2 in the next. These limitations can largely be overcome; the user can add directives to a data file to guide NTV's analysis of pathological situations.

Before pass 1 begins, all synchronizer bits are set to one—the normal case is that all devices will always pass changes in their inputs to their outputs. Pass one analyzes the circuit to find a maximal but conservative set of phases and devices that block changes on their inputs from reaching their outputs. Pseudocode for the pass one algorithm for analyzing synchronization points is presented in FIG. 10.

Synchronizers are determined for the circuit of FIG. 7b as follows. The input to the timing verifier is a wirelist of the circuit, with additional annotation information. Phase timing information may be entered by the designer, and some is derived by tools upstream of NTV. The phase timing information tells what phases clock signals are asserted in, and whatever timing assertions are available for data nodes ("node F is low during $\phi_1$," for instance). Other information tells which nodes are complements of each other, which are synonyms, etc. Other context information is available to NTV. For instance, it is known that an N device passes a 0 faster than does a P device, and a P device passes a 1 faster than an N device. So, for the transmission gate (M77 and M78) of FIG. 7b, M77 (the N device) is marked as passing 0, and M78 (the P device) is marked as passing 1. The above information is all available before NTV begins to analyze for synchronizers.

A CCR is a region of devices connected source-to-drain. For instance, in FIG. 6, M601–606 and the nodes at their sources/drains form one CCR, and M611–616 form another. In FIG. 7b, the $\overline{\text{CCIk}}$ CCR includes M71–74 and extends to the gates of M75 and M76. The algorithm selects a CCR, finds its output, and analyzes it. The algorithm traces each channel-connected path from the output to $V_{ss}$, $V_{dd}$, a primary input node, or nodes that are effectively primary inputs to a split CCR, and collects the logic equations for the SET (pullup) and RESET (pulldown) terms for the output node in sum-of-products canonical form. For the circuit of FIG. 6, the SET term for Q is $\overline{Q}$, and the RESET term is $\phi_1 \overline{DC} + \phi_1 \overline{DB} + \phi_1 \overline{DA}$. For Q of FIG. 7b, the SET equation is $\overline{\text{CCIk}} \cdot D$ and the RESET equation is $\text{CCIk} \cdot \overline{D}$. The logic minimization used to canonicalize these terms must account for a single signal driving two devices—it may not minimize out terms that include the same signal to different devices. The logic minimization exploits the phase timing information.

The algorithm sets the synchronizer bit for input N of a device M for phase φ if the above logic equations show that a transition on N can affect the output of the CCR. Thus, the "gate pass zero" synchronizer bits are set to create a $\phi_1$ synchronizer for M613, M614, M615, and M616 of FIG. 6, and the "gate pass one" synchronizer bits are set to create a $\phi_1$ synchronizer for M603–616.

The process of setting the synchronizers for the source inputs is somewhat different. For the gate synchronizers, the analysis considered a CCR. For source synchronizers, the analysis considers a transistor. The analysis looks at the gate of the transistor: if the gate is forced to the value that turns the transistor off (0 for an N device, 1 for a P), then the source is blocked, and the source synchronizer bit for the phase is turned off. Thus, for the circuit of FIG. 7b, M71 source is blocked in $\phi_1$ and passes in all other phases. M72, M74 and M76 sources pass in all phases. M73, M75, M77, and M78 sources pass in $\phi_1$ and are blocked in all other phases.

Source synchronizers and gate synchronizers can be analyzed in either order.

Pass Two: timing constraints.

As noted, timing constraints fall into two broad categories: absolute and relative. Absolute timing constraints express a timing constraint relative to the reference clock, for example, "a falling transition on S must be complete by 2 ns into phase 3." All absolute constraints are entered by the designer. Relative constraints constrain a transition relative to another transition: "a falling transition on S must be complete by the time node T falls." Relative constraints may either be entered by the designer or derived by NTV. NTV derives several types of relative constraints. The user must enter absolute timing constraints for the primary output nodes if timing for these nodes is to be checked. For internal nodes that must be timing checked, for instance latch output nodes, the automatic timing constraint generation of NTV is generally adequate; indeed, because NTV is designed to always be pessimistic, it sometimes generates more constraints than are necessary to ensure proper circuit function.

NTV analyzes the circuit model for two types of timing constraints: complete-swing checks and glitch-based checks. Complete-swing checks resemble latch setup-time checks—ensuring that desired transitions have time to finish completely. They typically say that a path must transition completely before its controlling clock turns off. Glitch-based checks are related to avoiding inadvertent charge or discharge of dynamic nodes. They state that an input to a dynamic path must be negated before the path's clock turns on. NTV only deals with glitches caused by a data signal and a clock-like signal racing against each other—glitching due to a race between two data signals is not a pattern-independent problem, and so is not treated in NTV.

Pseudocode for the timing constraint evaluation of NTV is presented in FIG. 11. Two portions of this pseudocode are paraphrased in Tables 3 and 4. The algorithm of Table 3 generates most complete-swing timing constraints.

TABLE 3

Complete swing timing constraints

At each "important" (i.e., not gate-internal) dynamic or memoried node N:
1. search first for clocked series chains of directed devices to pull N high, and then chains to pull N low, such that the chain finishes at N, and starts at the closest $V_{ss}$, $V_{dd}$, gate output, static node, or chip input to N.
2. For each chain, generate the constraint that N must rise (for, e.g., a pullup chain) before the chain's clock is negated. However, if N has weak feedback, the latch output node must fall before the clock is negated.
3. If step #1 finds a low-going path but not a high-going (or vice-versa), then search for the missing sense:
   For each device driving N, part of the same logic gate, and which can supply the missing sense, do a complete-swing check recursively on its input to find the missing path.

NTV chooses a node arbitrarily, and calls "is_worthwhile_dynamic_node" to determine whether it's worthwhile to determine timing constraints for the node. An example of a node that is not worthwhile is an internal node of a static gate. (NTV does not rederive gate boundaries; "is_worthwhile_dynamic_node" is tuned to filter out nodes that "look like" gate-internal nodes.) Examples of worthwhile nodes include all state or memory nodes not internal to a gate.

NTV walks back through the nodes and devices of the CCR driving the worthwhile node, back to a primary input node or power/ground. For all devices walked through, if the gate of the device is clocked (that is, if there are phases where the value of the gate is guaranteed), NTV determines whether the gate forces the device off. If the device is being shut off, and the shutting off of this device will cause the output of the CCR to go into its memory state, then NTV will generate a complete-swing constraint for the output of the CCR relative to the clock node.

To consider the example of FIG. 7b, CClk is guaranteed to be off except during $\phi_1$, and thus M77 is guaranteed to be off except during $\phi_1$. Thus, data D is constrained to arrive at output Q before M77 turns off. Stated in terms of the constraint data structure, "any falling transition on Q must complete before CClk falls in phase 2." Similarly, tracing Q back through M78 results in the constraint "any rising transition on Q must complete before $\overline{CClk}$ rises in phase 2."

Several interesting cases make generating complete-swing constraints difficult. For instance, FIG. 9b shows an n-pass NAND gate, which seems to imply rising and falling complete-swing constraints on Q. However, Q is static, and thus the complete-swing constraints are removed. NTV handles this by only starting the search at dynamic or memoried nodes, and thus generates no timing constraint for this circuit.

Figure 9A:
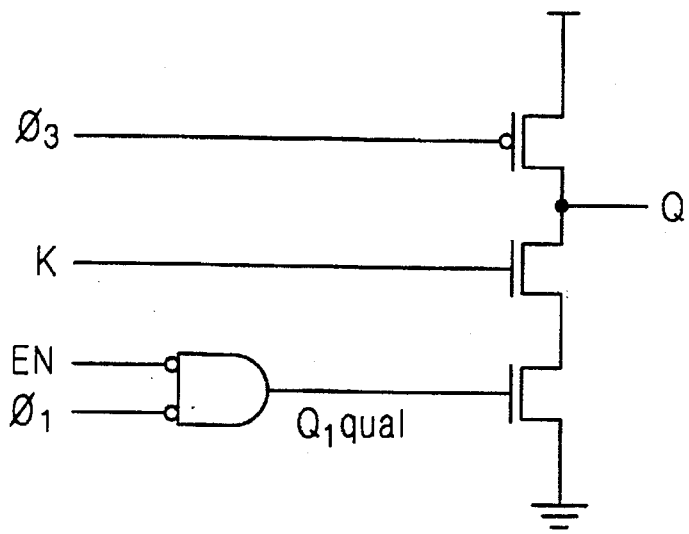
Figure 9B:
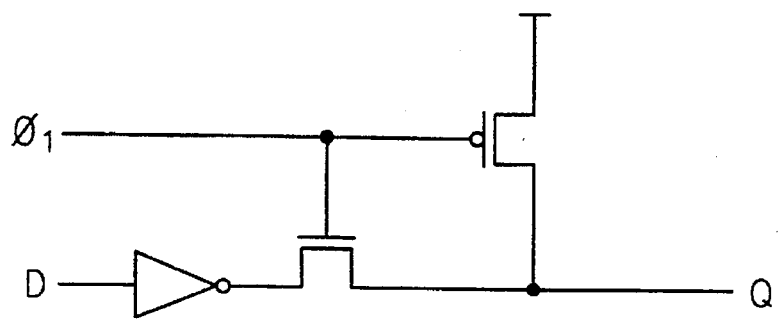
Figure 9C:
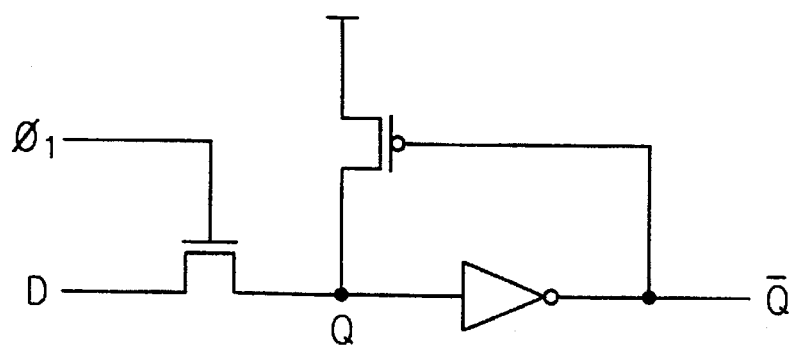

Latches with weak feedback, for instance the ratioed latch of FIG. 9c, have a more stringent constraint: not only must the latch transition completely before its clock is negated, but the feedback node must do so as well, or else the latch may spontaneously revert to its original value. Rule 2 handles this case, and generates the timing constraints: "any rising/falling transitions on $\overline{Q}$ must complete before $\phi_1$ falls"—it is insufficient for Q alone to transition before $\phi_1$ falls.

Figure 9D:
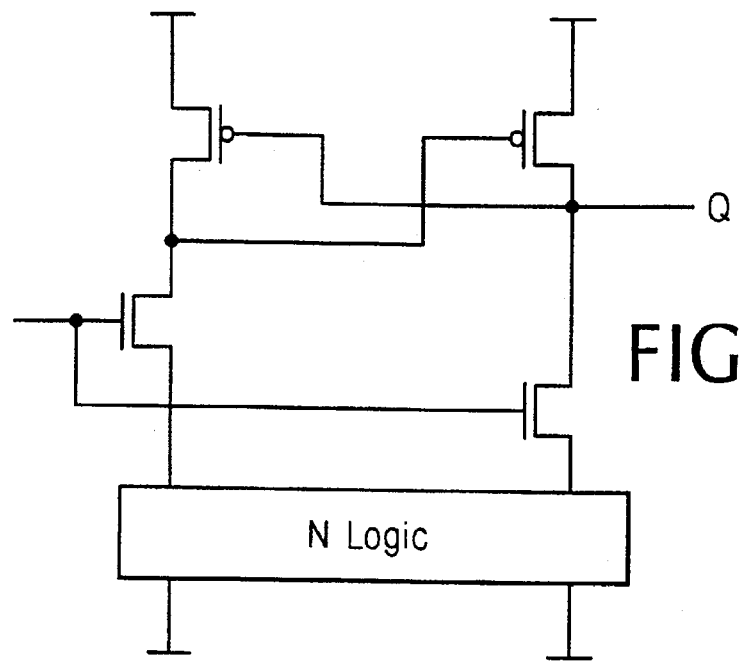

Some latches, for instance the cascode latch of FIG. 9d, do not have a clocked pullup path, relying on static feedback instead. Nevertheless, their outputs must rise before the clocked-pulldown path shuts off (i.e., the "static" feedback path is actually clocked from a different channel-connected region). Rule 3 handles these cases, and comes into play when the original, fast algorithm of Rule 1 has failed to find a path in a single channel-connected region. Rule 3 implements the realization that any useful node must swing in both directions, and hunts over a wider search space for the path that it knows must exist. The timing constraint generated for the circuit of FIG. 9d is "any rising/falling transitions on Q must complete before $\phi_1$ falls."

Figure 9E:
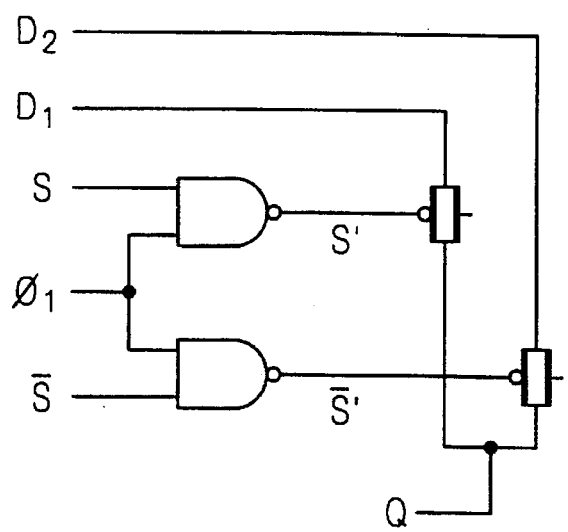
Figure 9F:
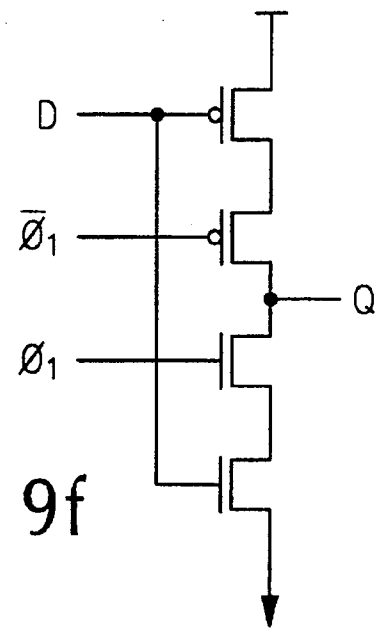

For the tristate inverter of FIG. 9f, the constraints generated are (1) "any rising transition on Q must complete before $\overline{\phi}_1$ rises," (2) "any falling transition on Q must complete before $\phi_1$ falls." it is also true that D can rise or fall during $\phi_1$ since Q is static during $\phi_1$.

The algorithm of Table 4 inserts glitch-based timing constraints. Glitches may occur anywhere two signals meet at a gate. But they are only fatal if they propagate to dynamic, RS-latch, or memory nodes, since these cannot recover. Furthermore, even these nodes may be insensitive in certain phases. Also, certain structures are sensitive to only one polarity of glitches. For example, the dynamic mux in FIG. 9e is insensitive to $\phi_1$ glitches, even though its NAND gate can generate them. The constraints generated for FIG. 9e are (1) "any falling transition on Q must complete before S' rises," and (2) "any falling transition on Q must complete before $\overline{S}^T$ rises." But S and $\overline{S}$ can rise/fall during $\phi_1$ since Q is static during $\phi_1$.

TABLE 4

Glitch-based checks

We start at glitch-sensitive points and trace back to see what can activate them.
4. Start at "intrinsically" glitch-sensitive nodes:
   (a) NOR RS inputs should never glitch high.
   (b) NAND RS inputs can never glitch low.
   (c) ∀ important nodes N which may be dynamic/memoried in a given phase $\phi_x$: if N can conditional-fall in $\phi_x$, then it is not allowed to glitch low in $\phi_x$; if N can conditional-rise in $\phi_x$, then it is not allowed to glitch high in $\phi_x$.
5. Determine paths that can activate the undesired glitch. If a node N is not allowed to glitch (e.g.,) low in $\phi_x$, then trace all channel-connected paths P that

TABLE 4-continued

Glitch-based checks (a) Finish at N.
    (b) Start at the nearest node that is stable in $\phi_x$ (e.g., $V_{ss}$, $V_{dd}$, $\phi_y$ data) or gate output node.
  6. Generate constraints. ∀ paths P that can be activated on $\phi_x$, then
    (a) all data inputs with dynamic fanout (i.e., which can affect N when it's dynamic) to P must be negated before the clock that turns P on is activated.
    (b) Conditional-clock inputs to P must not glitch on during $\phi_x$; this condition is applied recursively.

Rule 4 defines which nodes are glitch-sensitive. Only memory nodes can trap glitches. RS latches, due to their particular type of feedback structure, only pass transitions of one sense. Also, unconditionally-transitioning nodes will always recover from any inadvertent transition.

Rule 5b prunes the search space by observing that a node that is stable in $\phi_x$ cannot contribute to downstream $\phi_x$ glitches. It further notices that, when gates drive pass devices, the gate is a conceptually separate element, which prevents the pass device in FIG. 9b from being lumped with the inverter's N device into a single, incorrect, glitch path.

Rule 6a notices that, even though a path being negated while its clock is active causes an inadvertent glitch, there is not problem with the path being activated while its clock is active. The resultant output will start to transition partway through the clock period, which is fine so long as the relevant complete-swing constraint is still met. This is standard behavior for domino logic.

This is demonstrated in the examples of FIGS. 9e and 9f: both are guaranteed static on $\phi_1$. Intuitively, this handles the factor that tristate devices are only "quasi"- dynamic—i.e., whether they are dynamic depends on their enable signal, but not on their data. For FIG. 9f, NTV will generate two complete-swing constraints: "Q must rise before $\bar{\phi}_1$ rises." and "Q must fall before $\phi_1$ falls." But D may glitch during phase 1, while the latch is open. The glitch may propagate through, but if it will not reach a memory node, NTV does not report a timing violation.

FIG. 9a shows a precharge/discharge latch. The constraints generated for this circuit are: 1) "any falling transition on K must complete before $\phi_1$_equal rises" (but K need not rise before $\phi_1$_qual rises, e.g., domino logic), 2) "any rising transition on EN must complete before $\bar{\phi}_1$ falls" (but EN need not fall before $\bar{\phi}_1$ falls). NTV will also genrate a complete-swing constraint, "any falling transition on Q must complete before $\bar{\phi}_1$ qual falls."

Finally, rule 6b generates the constraint on EN in FIG. 9a, by propagating glitches to sensitive points. It optimizes execution speed by noting that unconditional clocks cannot be glitch-sensitive (for exactly same reasons as in Rule 4c).

Considering the case of FIG. 7b for a glitch at the beginning of $\phi_1$, NTV must ensure that there is no glitch on CClk, which implies no glitch on $\overline{CClk}$. The constraint "any rising transition on EN must complete before clock $\phi_1$ rises" will enforce this, and thus this is the constraint that is inserted.

Perfect constraint generation, is, simply, impossible. The analog interactions between devices defy any provably robust classification theory, so a realizable tool must make simplifying assumptions. Furthermore, even the ways in which purely digital circuits interact is complex. For example, the constraints in FIG. 9e depend on the fact that the multiplexer's output is static in $\phi_1$, which in turn depends on S and $\bar{S}$ being complementary. However, the general case of proving that inputs derived from complex logic are complementary is an undecidable problem, beyond the scope of NTV for all but a few simple cases.

The theoretical underpinnings of the timing constraint analysis is presented in "Constraint Identification for Timing Verification" by Joel Grodstein, Jengwei Pan, Bill Grundmann, Bruce Gieseke, and Y. T. Yen, published in "ICCAD '90," the proceedings of the IEEE International Conference on Computer Aided Design, Nov. 1990, available from IEEE Press, and incorporated herein by reference.

Pass Three: timing propagation.

Timing propagation proceeds essentially as discussed in the background. A depth-first timing propagation probe begins at a primary input node and ends at any of four termination conditions:

1. a primary output node—a node with no successor in the model.
2. a false path. (False paths are discussed in commonly-owned and copending U.S. patent application Ser. No. 07/897,789, incorporated herein by reference.)
3. The path is not worst-case.
4. A blocking synchronizer.

A "blocking synchronizer" is determined as follows. When a pass three DFS probe reaches a device, the synchronizer bit for the appropriate (device, input, phase). tuple is queried (the phase taken from the last synchronizer traced). If the synchronizer bit is on, then the probe is not blocked and continues through the device and on downstream. If the synchronizer bit is off, first the synchronizer mask is queried to find the next bit (in circular phase order) that is on. The clock of the DFS walk is transformed to the phase corresponding to the on bit: for instance, if the system clock is 10ns per phase, the current DFS clock is $\phi_1$+27 ns, the $\phi_1$ and $\phi_2$ bits are off, but the $\phi_3$ bit is on, then the DFS time is transformed to $\phi_3$+7 ns. If the transformed arrival time is after the opening of the synchronizer, that is, if the offset is non-negative, then the path continues through the device. If the transformed offset is negative, then the path has arrived at the synchronizer before the synchronizer opens, the path is blocked, and the probe is abandoned.

NTV's conservative approach is somewhat paradoxical: during pass three, synchronizations are, in a sense, modeled in two different and conflicting ways. A transition arriving at a synchronizer is allowed to propagate if it arrives any time after the beginning of the phase in which the synchronizer opens, even if the actual clock signal opening the synchronizer is delayed from the theoretical beginning of the phase. But the model also accounts for the late clock by propagating the worst-case time, appropriately delayed by the late-arriving clock. NTV's conservative approach is to report all possible timing violations, even if this means erring by reporting spurious violations. Returning to the traffic light analogy, NTV must account for both the earliest possible case when a signal can proceed immediately when the light turns green, and also the latest possible case when the signal is delayed waiting for cross traffic to clear. The assumption that a synchronizer opens at time offset zero, rather than at the generally-later time that the timing verifier determines, forces the maximum number of paths to be traced.

Pass Four: Checking Timing Constraints.

This pass walks over all timing constraints and ensures that the constraints are satisfied—that the node transitions no later than the absolute or node-relative reference time. For a relative constraint, the transition time for the constrained node and the transition time for the reference node may be stated relative to different clock phases. Accordingly, the comparison inequality subtracts the two phase numbers, multiplies the difference by the cycle time, and adds the product to one of the time offsets before comparing the two offsets.

NTV is conservative: each of the limitations and simplifying assumptions noted above are accounted for in the algorithms by having them err on the side of reporting too many paths.

Often a user can analyze the output of NTV and determine that a timing violation is spurious: that NTV is too conservative, and that some higher-level consideration not visible to NTV makes the path legal. The user may advise NTV of this consideration by adding annotation to a user data file. For example, in the mux of FIG. 9e, after NTV reported the path failing due to a misunderstood constraint, the user could put the line

STATIC/PHASE=1 Q (node Q is static on phase 1) into the data file. This assures NTV that Q is not an interesting node on phase 1, and NTV would then not generate a constraint—the correct behavior. Other commands to NTV include:

DELETE/RELATIVE_TIMING_CHECK specifying two nodes. This prevents NTV from generating a timing constraint for the first node relative to the second node.

ADD/RELATIVE_TIMING_CHECK also specifies two nodes. NTV will add the appropriate timing constraint to those it derives for itself. Because NTV is pessimistic, this is rarely used. Constraints that must be added generally are neither full-swing nor pattern-independent glitch checks.

SET/NO_DYNAMIC makes a node static in all phases.

SHOW/BLOCKPOINTS, SHOW/TIMING_CHECK, and SHOW_NTV_TIMING force NTV to dump, respectively, the synchronizers, the timing constraints, and the node timings propagated through the network.

The combination of pessimistic algorithms (which at first can produce large amounts of spurious output) with fast, intuitive ways to eliminate that output, is effective in a full-custom user environment.

Other embodiments are within the claims.

Reference to Appendix

A source code listing of an embodiment of the invention is attached as Appendix A.

A portion of the disclosure of this patent document contains material that is subject to copyright protection. The copyright owner has no objection to the facsimile reproduction by anyone of the patent document or the patent disclosure as it appears in the Patent and Trademark Office file or records, but otherwise reserves all copyright rights whatsoever.

What is claimed is:

1. A computer-based method for improving a design of a circuit through analysis of a computer stored model of said circuit, said method comprising identifying individual synchronization points independent of timing constraints at said points in said circuit model at each of which a signal may be blocked or allowed to pass in response to appearance of a second signal at said synchronization point and;

verifying timing of said circuit based on said identified individual synchronization points.

2. The method of claim 1 further comprising identifying signal paths interconnecting synchronization points in said circuit model, said verifying step comprising determining the timings of hypothetical signals which are propagated along said signal paths and passed by said individual synchronization points.

3. The method of claim 1 further comprising identifying individual timing constraints in said circuit model each of which represents a required relative time sequence of occurrence of two signals in said circuit model, and verifying timing of said circuit based also on said individual timing constraints.

4. The method of claim 3 further comprising the steps:

receiving at a computer a wirelist representation of said circuit, parsing said wirelist representation to create said model, annotating said model with timing information based on said individual synchronization points, and evaluating said individual timing constraints based on said timing information.

5. The method of claim 3 wherein at least some of said individual timing constraints are identified by computer analysis of said model.

6. The method of claim 3 wherein at least one of said individual timing constraints comprises a complete-swing constraint ensuring that a transition on a signal completes early enough to ensure proper circuit function.

7. The method of claim 3 wherein at least one of said individual timing constraints comprise a glitch-based constraint ensuring that two signals do not overlap to cause a glitch-sensitive node to change its value.

8. The method of claim 3 wherein at least some of said individual timing constraints require a relative order of transitions of two signals of said circuit model.

9. The method of claim 1 or 3 wherein said identifying of said individual synchronization points further comprises a subset analysis, wherein said signals comprise sets of transitions, and a first set of transitions is determined to be a proper subset of a second set of transitions, and the circuit model is analyzed with respect to said second set and not said first set.

10. The method of claim 1 or 3 wherein said model comprises a device-level model.

11. The method of claim 1 or 3 wherein said identifying of at least some of said individual synchronization points is accomplished independent of any identification of a portion of said circuit as a latch.

12. The method of claim 1 or 3 wherein said circuit comprises conditional clock signals, and said individual synchronization points are identified relative to said conditional clock signals.

13. The method of claims 1 or 3 wherein said individual synchronization points distinguish by their values said signals that may be blocked or that may be allowed to pass.

14. The method of claims 1 or 3 wherein said individual synchronization points are identified for gate inputs and source inputs of devices of said circuit.

15. The method of claims 1 or 3 wherein said timing constraints are identified under at least one of the following assumptions:

analog effects within said circuit can be modelled as worst-case digital effects, said individual synchronization points can be derived based on specified interactions between channel-connected regions of said circuit, and transitivity holds within any single channel-connected region of said circuit.

16. The method of claims 1 or 3 wherein said individual synchronization points are identified based on a minterm description of said circuit, and said minterms are derived by an enumerative evaluation of inputs to a portion of said circuit model.

\* \* \* \* \*